(12) United States Patent
Uchida et al.

(10) Patent No.: US 11,650,270 B2
(45) Date of Patent: *May 16, 2023

(54) MAGNETIC SENSOR

(71) Applicant: TDK Corporation, Tokyo (JP)

(72) Inventors: Keisuke Uchida, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/536,689

(22) Filed: Nov. 29, 2021

(65) Prior Publication Data

US 2022/0082641 A1 Mar. 17, 2022

Related U.S. Application Data

(63) Continuation of application No. 16/665,185, filed on Oct. 28, 2019, now Pat. No. 11,209,503, which is a continuation of application No. 15/825,289, filed on Nov. 29, 2017, now Pat. No. 10,557,896.

(30) Foreign Application Priority Data

Mar. 24, 2017 (JP) .............................. JP2017-058523

(51) Int. Cl.
| | | |
|---|---|---|
| G01R 33/09 | (2006.01) | |
| H01F 10/32 | (2006.01) | |
| H01F 3/00 | (2006.01) | |
| H01F 1/12 | (2006.01) | |

(52) U.S. Cl.
CPC .......... *G01R 33/09* (2013.01); *G01R 33/093* (2013.01); *H01F 1/12* (2013.01); *H01F 3/00* (2013.01); *H01F 10/3254* (2013.01); *H01F 10/3268* (2013.01)

(58) Field of Classification Search
CPC .... G01R 33/09; G01R 33/093; H01F 10/3268
See application file for complete search history.

(56) References Cited

U.S. PATENT DOCUMENTS

| | | | | |
|---|---|---|---|---|
| 5,761,009 | A * | 6/1998 | Hughbanks | G11B 5/11 360/323 |
| 5,923,504 | A * | 7/1999 | Araki | H01L 43/10 |
| 7,292,414 | B1 | 11/2007 | Mallary | |
| 9,047,884 | B2 * | 6/2015 | McNeill | G11B 5/398 |

(Continued)

FOREIGN PATENT DOCUMENTS

| | | |
|---|---|---|
| JP | 2005-049185 A | 2/2005 |
| JP | 2009-175120 A | 8/2009 |

(Continued)

*Primary Examiner* — Alvaro E Fortich
(74) *Attorney, Agent, or Firm* — Posz Law Group, PLC

(57) ABSTRACT

The magnetic sensor can prevent an increase of a positional detection error of a subject/object even in the case of applying an external magnetic field with a magnetic field intensity exceeding a predetermined range. A magnetic sensor is equipped with a magnetoresistive effect element (MR element) 11 that can detect an external magnetic field and a soft magnetic body shield 12. The soft magnetic body shield(s) 12 are/is positioned above and/or below the MR element 11 in a side view, and the size of the MR element 11 is physically included within a perimeter of the soft magnetic body shield 12.

19 Claims, 21 Drawing Sheets

(56) References Cited

U.S. PATENT DOCUMENTS

| | | | |
|---|---|---|---|
| 9,196,270 B1 | 11/2015 | Yang et al. | |
| 11,209,503 B2 * | 12/2021 | Uchida | G01R 33/09 |
| 2002/0075608 A1 | 6/2002 | Kawato | |
| 2002/0171982 A1 | 11/2002 | Lairson et al. | |
| 2005/0116255 A1 * | 6/2005 | Kato | H01L 27/222 |
| | | | 257/E27.005 |
| 2006/0202692 A1 | 9/2006 | Tatschl et al. | |
| 2007/0053114 A1 | 3/2007 | Uesugi et al. | |
| 2009/0201600 A1 * | 8/2009 | Komura | G11B 5/102 |
| | | | 360/59 |
| 2009/0279213 A1 * | 11/2009 | Wu | G11B 5/3912 |
| | | | 360/319 |
| 2010/0270866 A1 * | 10/2010 | Ide | G01R 33/098 |
| | | | 307/91 |
| 2011/0175605 A1 | 7/2011 | Kim et al. | |
| 2012/0062224 A1 | 3/2012 | Ide et al. | |
| 2013/0028011 A1 | 1/2013 | Kitagawa et al. | |
| 2014/0197505 A1 | 7/2014 | Zhou et al. | |
| 2014/0225596 A1 | 8/2014 | Nakamura et al. | |
| 2014/0268418 A1 | 9/2014 | McKinlay et al. | |
| 2014/0293474 A1 | 10/2014 | Yamane et al. | |
| 2017/0343584 A1 * | 11/2017 | Abe | G01R 15/148 |

FOREIGN PATENT DOCUMENTS

| | | |
|---|---|---|
| JP | 2011-007685 A | 1/2011 |
| JP | 2013-210335 A | 10/2013 |
| JP | 2015-064246 A | 4/2015 |
| JP | 2016-524142 A | 8/2016 |
| JP | 2016-535845 A | 11/2016 |
| WO | 2009/084435 A1 | 7/2009 |
| WO | 2016/148022 A1 | 9/2016 |

* cited by examiner

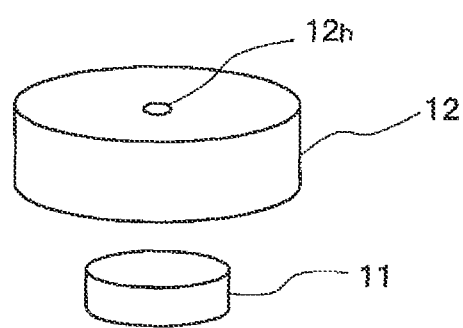
FIG. 1 2 A
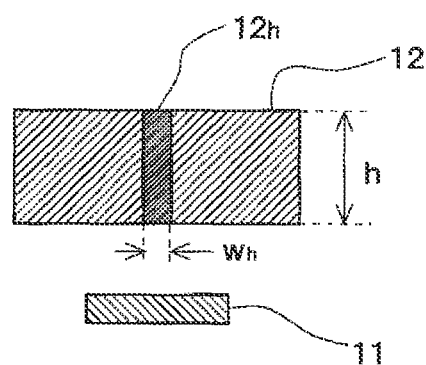
FIG. 1 2 B

MAGNETIC SENSOR

CROSS REFERENCE TO RELATED APPLICATIONS

The present application is a continuation application of U.S. utility application Ser. No. 16/665,185 filed on Oct. 28, 2019 which is a continuation application of U.S. utility application Ser. No. 15/825,289 filed on Nov. 29, 2017, which is based on Japanese Patent Application No. 2017-058523 filed on Mar. 24, 2017, the contents of which are incorporated herein by reference.

TECHNICAL FIELD

The present invention relates to a magnetic sensor.

BACKGROUND TECHNOLOGY

Conventionally, a magnetic sensor is widely used for applications, such as detection of a rotational position of vehicle steering or the like or detection of the linear displacement of an object. The magnetic sensor is a sensor that can detect the rotational position or linear displacement of an object, by detecting the orientation and magnitude of a magnetic field that is generated from a magnet placed in an object to be detected. Recently, a magnetoresistive effect element (MR element), which is a multilayer body having a magnetization free layer and a magnetization pinned layer, where the resistance of the MR element varies in accordance with a change of the magnetization direction of the free layer according to an external magnetic field, has been widely used as a magnetic sensor. When the external magnetic field acts on the MR element, the magnetization direction of the magnetization free layer is changed, and the relative angle with the magnetization direction in the magnetization pinned layer is changed. The change of the magnetization direction appears as a change in the magnetic resistance of the MR element, enabling the detection of the intensity of the external magnetic field.

PRIOR ART

Patent Literature

[Patent Literature 1] Japanese Patent Application Laid-Open 2013-210335

[Patent Literature 2] Japanese Translation of PCT International Application Publication No. JP-T-2016-535845

SUMMARY OF THE INVENTION

Problem to be Solved by the Invention

The predetermined range of a magnetic field intensity for the external magnetic field to be detected is set in a magnetoresistive effect element (MR element) used for an application to detect the rotational position or linear displacement of an object or the like. When an external magnetic field with the magnetic field intensity within the range is applied to the MR element, the rotational position, the linear displacement or the like of the object is detected based upon the output of the MR element.

Meanwhile, another external magnetic field, such as the leakage field from a motor or geomagnetism, may be applied to an MR element other than the external magnetic field to be generated from a magnet, due to its use environment or the effect of a usage or the like. Due to the effects of other external magnetic fields, when an external magnetic field with a magnetic field that exceeds the predetermined range is applied to the MR element, the error of position detection, such as a rotational position or a linear displacement in an object, becomes greater.

The present invention has been accomplished by taking such actual circumstances as mentioned above into consideration and has the objective of providing a magnetic sensor that can prevent increasing an error in the position detection of an object even when an external magnetic field with a magnetic field intensity that exceeds the predetermined range is applied.

Means for Solving the Problem

To solve the above problem, the present invention provides a magnetic sensor that is equipped with a magnetoresistive effect element (MR element), which can detect an external magnetic field, and a soft magnetic body shield, wherein the soft magnetic body shield(s) are positioned above and/or below the MR element(s) in a side view, and the size of the MR element is physically included within a perimeter of the soft magnetic body shield in a plan view (Invention 1).

According to the invention (Invention 1), because the soft magnetic body shield(s) has a perimeter which physically includes the size of the MR element(s) in a plan view, is positioned above and/or below the MR element in a side view, even if an external magnetic field with a magnetic field intensity that exceeds a predetermined range is applied, an increase error in the position detection of an object can be prevented.

In the invention (Invention 1) above, it is preferable that shape of the soft magnetic body shield in a plan view is nearly circular (Invention 2), and it is preferable that the shape of the soft magnetic body shield in a plan view is an N-sided polygon (N is 6 or greater even number) (Invention 3).

In the invention (Invention 1) above, it is preferable that the soft magnetic body shield be columnar (Invention 4), and that the soft magnetic body shield can be conical (Invention 5).

In the invention (Invention 1) above, the soft magnetic body shield can include a columnar portion, which is equipped with a first surface and a second surface, where the second surface faces the first surface, and a convexity, which protrudes from the first surface side of the columnar portion and can be positioned to allow the second surface to face the MR element (Invention 6). The soft magnetic body shield can include a columnar portion equipped with a first surface and a second surface, where the second surface faces the first surface, and a concave portion, which is formed on the first surface side of the columnar portion and can be positioned to allow the second surface to face the MR element (Invention 7).

In the invention (Invention 1) above, the soft magnetic body shield may have a through-hole that penetrates through the soft magnetic body shield in the thickness direction (Invention 8).

In the invention (Invention 1) above, it is preferable that the diameter $\varphi_s$ of the soft magnetic body shield and the diameter $\varphi_m$ of the MR element fulfill a relationship in the following formula (1) (Invention 9), and it is preferable that the thickness h of the soft magnetic body shield and the diameter $\varphi_m$ of the MR element fulfill a relationship in the following formula (2) (Invention 10):

$$\varphi_s \geq 1.3\, \varphi_m \qquad (1)$$

$$h > 0.3\, \varphi_m \qquad (2)$$

In the invention (Invention 1) above, it is preferable that a harmonic component $V_{3rd}$, which is output in the case of applying an external magnetic field with a magnetic field intensity that exceeds 70 mT (Millitesla) to the MR element, and a harmonic component $V_{3rd}$, which is output in the case of applying an external magnetic field with 70 mT or less of a magnetic field intensity to the MR element, are nearly the same (Invention 11).

In the invention (Invention 1) above, the magnetic sensor has a plurality of the MR elements, and it is preferable that the soft magnetic body shields are placed in correspondence with the MR elements, respectively (Invention 12), and in this case, it is preferable that the diameter $\varphi_s$ of each of the soft magnetic body shields be 2.00 to 2.75 times the diameter $\varphi_m$ of the corresponding MR element (Invention 13).

Effect of the Invention

According to the present invention, even when an external magnetic field with a magnetic field intensity that exceeds a predetermined range is applied, it is possible to prevent an increase of error in position detection of an object.

BRIEF DESCRIPTION OF DRAWINGS

FIG. 12A is an entire schematic perspective view showing a magnetic sensor relating to the sixth embodiment of the present invention.

FIG. 12B is a schematic cross-sectional view showing the magnetic sensor relating to the sixth embodiment of the present invention.

FIG. 15 is a characteristic chart showing an attenuation effect of a magnetic field intensity to be applied to the MR element in the case of using a soft magnetic body shield of Example 3.

FIG. 16 is a characteristic chart showing an attenuation effect of a magnetic field intensity to be applied to the MR element in the case of using a soft magnetic body shield of Example 4.

MODE FOR CARRYING OUT THE INVENTION

Figure 1:
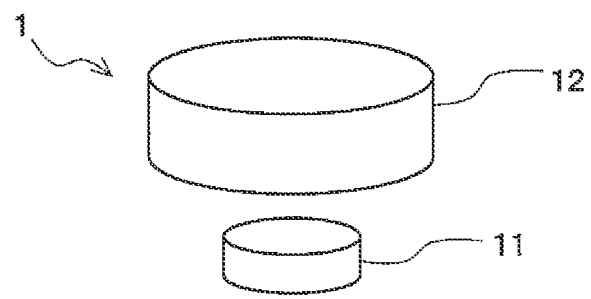
FIG. 1A is a schematic perspective view showing a magnetic sensor relating to the first embodiment of the present invention.
FIG. 1B is a schematic side view showing the magnetic sensor relating to the first embodiment of the present invention.
FIG. 1C is a schematic plan view showing the magnetic sensor relating to the first embodiment of the present invention.
Figure 1:
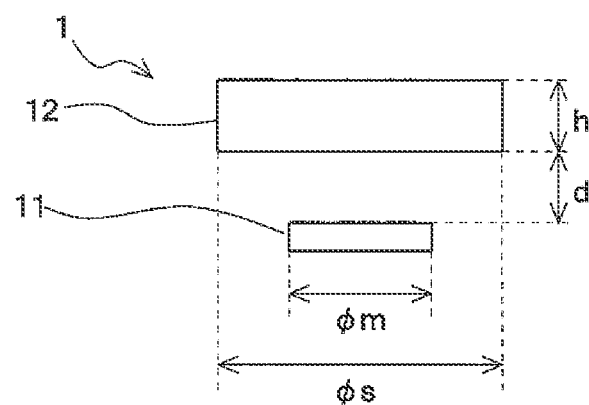
Figure 1:
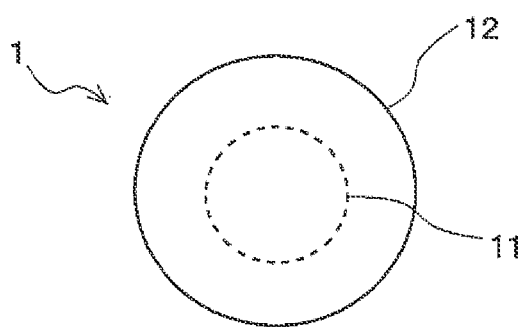

Embodiments of the present invention are explained hereafter with reference to the drawings. Furthermore, the drawings are schematic or conceptual, and dimensions of each member, the ratio of size between members and the like are not always realistic, and even if the same members or the like are indicated, mutual dimensions and ratio(s) may be differently indicated in each drawing. Further, in the drawings attached to the present specification, to facilitate understanding, shape, scale reduction, horizontal and vertical dimensional ratios and the like of each part may be changed or exaggerated from the actual ones.

First Embodiment

FIG. 1A is a schematic perspective view showing a magnetic sensor 1 relating to a first embodiment of the present invention; FIG. 1B is a schematic side view showing the magnetic sensor 1 relating to the first embodiment of the present invention; and FIG. 1C is a schematic plan view showing the magnetic sensor 1 relating to the first embodiment of the present invention. The magnetic sensor 1 is used for detecting a rotation angle due to relative movement of a rotor or the like and a linear displacement or the like of an object. For example, a magnet as a magnetic field generating part is placed in a rotating body, which is an object for detection of a rotation angle, and the magnetic field generating part generates the magnetic field to be detected. When the magnetic sensor 1 which is incorporated into a rotation angle sensor is used, the magnetic sensor 1 produces an angle detection value having a correspondence relationship with the angle between the direction of the magnetic field to be detected at a reference position and the reference direction.

The magnetic sensor 1 relating to the first embodiment is equipped with a magnetoresistive effect element (MR element) 11 and a soft magnetic body shield 12. As shown in FIG. 1B, the magnetic sensor 1 relating to the first embodiment is configured such that the soft magnetic body shield 12 is positioned above the MR element 11 in a side view, and the size of the MR element 11 becomes any size physically included within the perimeter of the soft magnetic body shield 12 in a plan view. Hereafter, each component in the magnetic sensor 1 relating to the first embodiment will be explained in detail.

Figure 2:
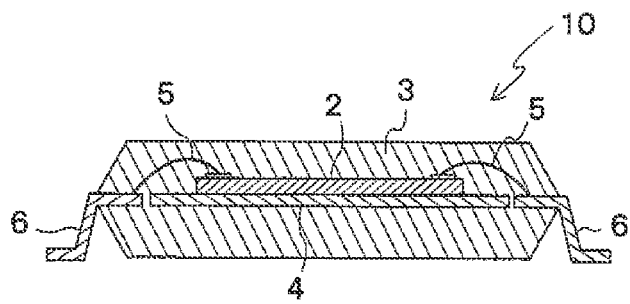
FIG. 2A is cross-sectional view showing a schematic configuration of a magnetic sensor package including the magnetic sensor relating to the first embodiment of the present invention.
FIG. 2B is circuit diagram showing a schematic configuration of a detection circuit using the magnetic sensor relating to the first embodiment of the present invention.
Figure 2:
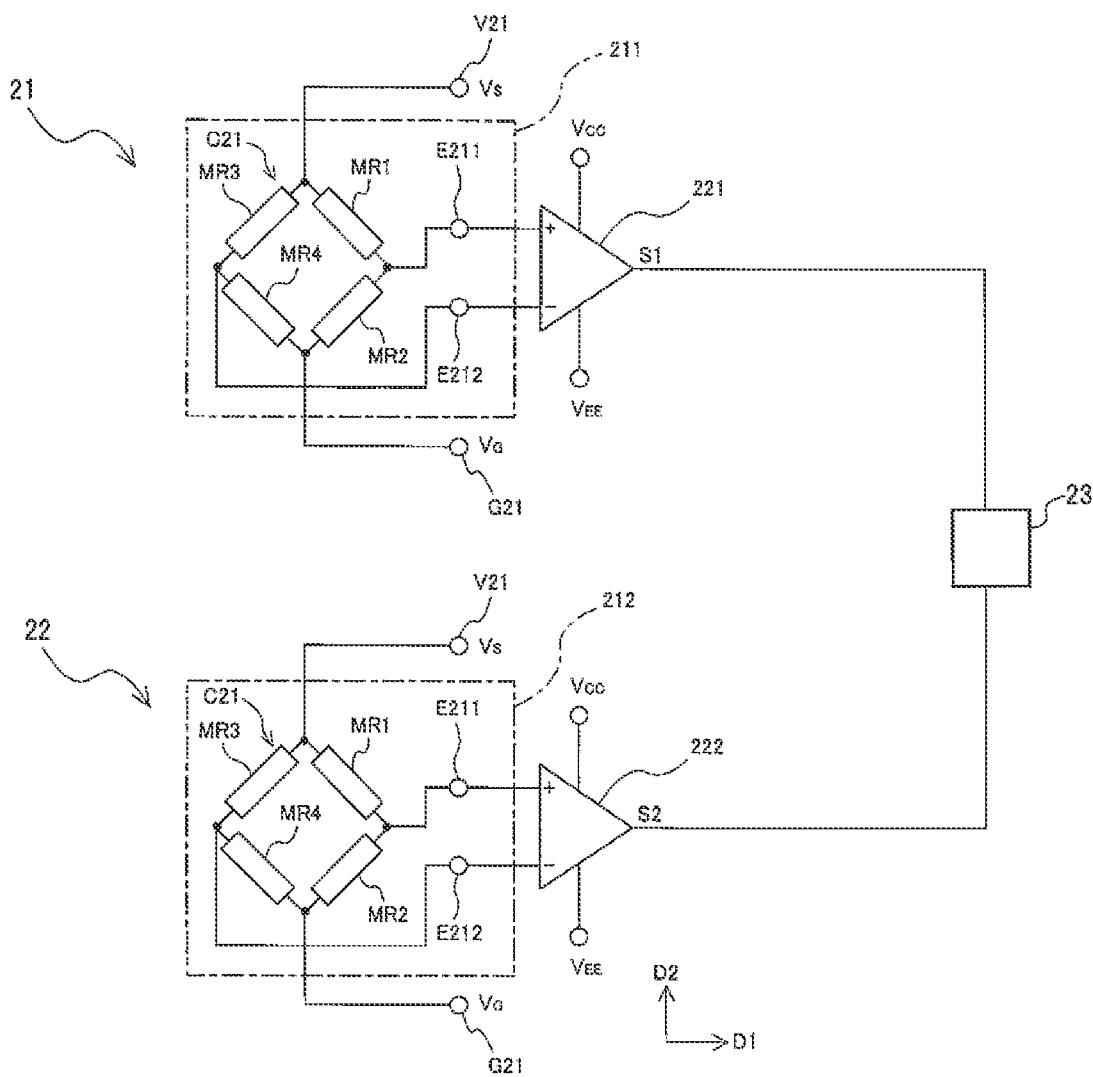

FIG. 2A is cross-sectional view showing a schematic configuration of a magnetic sensor package 10 including the magnetic sensor relating 1 to the first embodiment; and FIG. 2B is circuit diagram showing a schematic configuration of a detection circuit using the magnetic sensor relating to the first embodiment. The magnetic sensor package 10 has a base 4, a magnetic sensor part 2 placed on the base 4, connection leads 6, wiring parts 5, such as a bonding wire, which electrically connect the magnetic sensor part 2 with the connection leads 6, and a sealing part 3 that integrally seals them. The sealing part 3 is composed by a resin material, such as epoxy resin. The magnetic sensor part 2 includes the magnetic sensor 1.

The magnetic sensor part 2 has magnetic detection element circuits 21 and 22 that output a detection signal in association with a change of the external magnetic field, as a magnetic field detection part, respectively. The magnetic detection element circuit 21 outputs a detection signal $V_{OUT}$ having a corresponding relationship with the angle formed between the direction of the magnetic field to be detected and the first direction D1. The magnetic detection element circuit 22 outputs a detection signal $V_{OUT}$ having a corresponding relationship with the angle formed between the direction of the magnetic field to be detected and the second direction D2.

An operational amplifier 221 is connected to the magnetic detection element circuit 21, amplifies the detection signal $V_{OUT}$ and outputs a sensor signal S1. An operational amplifier 222 is connected to the magnetic detection element circuit 22, amplifies the detection signal $V_{OUT}$ and outputs a sensor signal S2. An operation part 23 calculates an angle detection value having a corresponding relationship with an angle θ based upon the two signals S1 and S2. Furthermore, the operating part 23 includes an angle detection value calculation part, a correction processing part and a correction information retaining part, but a detailed explanation about these will be omitted.

The magnetic detection element circuit 21 has a Wheatstone bridge circuit including at least one pair of magnetic detection elements configured by two magnetic detection elements connected in series. As shown in FIG. 2B, in the present embodiment, the magnetic detection element circuit 21 has a Wheatstone bridge circuit C21, which includes a first pair of magnetic detection elements in which a first magnetic detection element MR1 and a second magnetic detection element MR2 are connected in series, and a second pair of magnetic detection elements, in which a third magnetic detection element MR3 and a fourth magnetic detection element MR4 are connected in series.

As shown in FIG. 2B, the Wheatstone bridge circuit C21 includes the first pair of magnetic detection elements, the second pair of magnetic detection elements, a power port V21, where one terminal of the first magnetic detection element MR1 and one terminal of the third magnetic detection element MR3 are connected, a ground port G21, where one terminal of the second magnetic detection element MR2 and one terminal of the fourth magnetic detection element MR4 are connected, a first output port E211, and a second output port E212. The first output port E211 is connected between (at a midpoint of) the first magnetic detection element MR1 and the second magnetic detection element MR2 in the first pair of magnetic detection elements, and the second output port E212 is connected between (at the midpoint of) the third magnetic detection element MR3 and the fourth magnetic detection element MR4 in the second pair of magnetic detection elements. The power port V21 is connected to a first power supply source Vs that is capable of supplying an electric current to the magnetic detection element circuit 21, and the ground port G21 is connected to a ground (reference potential point) VG. Furthermore, the first power supply source $V_s$ may be a constant-voltage power supply that is capable of supplying constant voltage or may be a constant-current power supply that is capable of supplying a constant current.

Similarly, the magnetic detection element circuit 22 also has a Wheatstone bridge circuit including at least one pair of magnetic detection elements configured by two magnetic detection elements connected in series. As shown in FIG. 2B, in the present embodiment, the magnetic detection element circuit 22 has the Wheatstone bridge circuit C21, which includes the first pair of magnetic detection elements, where the first magnetic detection element MR1 and the second magnetic detection element MR2 are connected in series, and the second pair of magnetic detection elements, where the third magnetic detection element MR3 and the fourth magnetic detection element MR4 are connected in series. Since the specific configuration of the magnetic detection element circuit 22 is similar to that of the magnetic detection element circuit 21, an explanation thereof is omitted.

In the first embodiment, when an external magnetic field with a magnetic field intensity that exceeds the predetermined range is applied, waveforms of the first signal S1 and the second signal S2 that are output from the magnetic detection element circuits 21 and 22, respectively, are distorted, and an ideal component, which is periodically changed to draw an ideal sine curve, and one or more error components, which are equivalent to one or more harmonics relative to the ideal component, are included. Because the signals S1 and S2 include one or more error components, respectively, an angle detection value $\theta_s$ shall include an error. In general, in the magnetic sensor, it has been known that the angle error will change in accordance with the intensity of the magnetic field to be detected, i.e., a magnetic field intensity dependency of the angle error exists. A third harmonic component $V_{3rd1}$ relative to the ideal component is included in the signal S1 as the error component, and a third harmonic component $V_{3rd2}$ relative to the ideal component is included in the signal S2 as the error component. The magnetic sensor 1 relating to the first embodiment is configured such that the third harmonic component will become roughly the same before and after the change of the magnetic field intensity even if the magnetic field intensity of the detected magnetic field is changed.

As the first to fourth magnetic detection elements MR1 to MR4 included in the Wheatstone bridge circuit C21, for example, the MR element, such as an AMR element, a GMR element or a TMR element is exemplified, and the GMR element, the TMR element and the like with comparatively great output voltage are particularly preferable.

Figure 3:
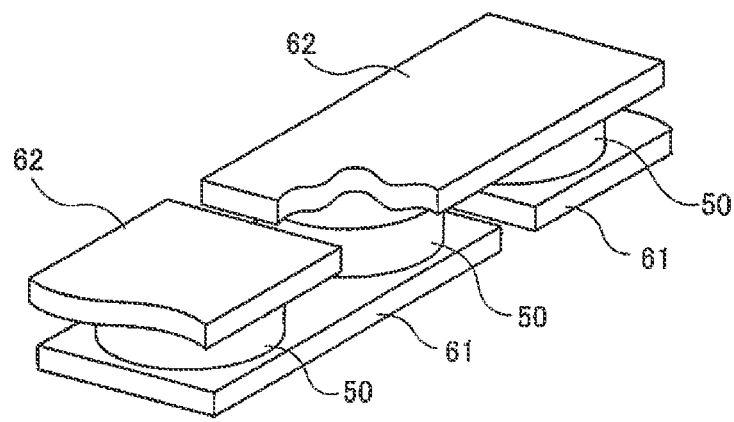
FIG. 3A is a perspective view showing a schematic configuration of a magnetoresistive effect element (MR element) relating to the first embodiment of the present invention.
FIG. 3B is a cross-sectional view showing a schematic configuration of the MR element relating to the first embodiment of the present invention.
Figure 3:
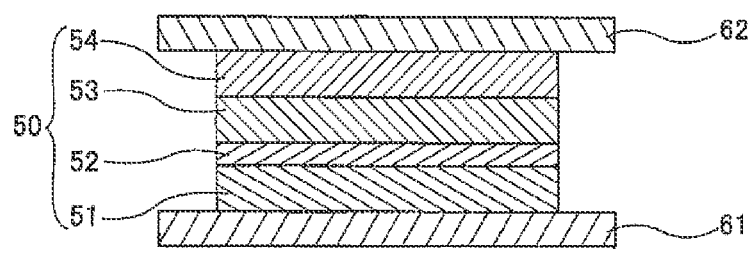

FIG. 3A is a perspective view showing a schematic configuration of the MR element 11 relating to the first embodiment; and FIG. 3B is a cross-sectional view showing a schematic configuration of the MR element relating to the first embodiment. The GMR elements and TMR elements as the first to fourth magnetic detection elements MR1 to MR4, as shown in FIG. 3A, have a plurality of lower-side lead electrodes 61, a plurality of MR multilayer bodies 50 and a plurality of upper-side lead electrodes 62, respectively. The lower-side lead electrodes 61 and the upper-side lead electrode 62, for example, are composed by one type of conductive material among Cu, Al, Au, Ta, Ti and the like or a composite membrane of two or more types of conductive materials, for example, and their thicknesses are around 0.3 μm to 2.0 μm, respectively.

The plurality of lower-side lead electrodes 61 are placed on a substrate (not shown). The plurality of lower-side lead electrodes 61 have a long and narrow nearly-rectangular shape, respectively, and are placed to have a predetermined gap between the two adjacent lower-side lead electrodes 61 in an electric series direction of the plurality of MR multilayer bodies 50 (see FIG. 6) that are arranged in an array manner. The MR multilayer bodies 50 are placed in the vicinity of both ends in the longitudinal direction of the lower-side lead electrode 61, respectively. In other words, two MR multilayer bodies 50 are placed on each of the plurality of lower-side lead electrodes 61, respectively.

The MR multilayer body 50 in the present embodiment, as shown in FIG. 3B, has a magnetization pinned layer 53 where its magnetization direction is pinned, a free layer 51 where its magnetization direction is changed according to the direction of the magnetic field to be applied, a nonmagnetic layer 52 that is arranged between the magnetization pinned layer 53 and the free layer 51, and an antiferromagnetic layer 54.

The MR multilayer body 50 has a structure where the free layer 51, the nonmagnetic layer 52, the magnetization pinned layer 53 and the antiferromagnetic layer 54 are laminated in respective order from the lower-side lead electrode 61 side. The free layer 51 is electrically connected to the lower-side lead electrode 61, and the antiferromagnetic layer 54 is electrically connected to the upper-side lead electrode 62. As a material to compose the free layer 51 and the magnetization pinned layer 53, for example, NiFe, CoFe, CoFeB, CoFeNi, Co$_2$MnSi, Co$_2$MnGe, FeOx (oxide of Fe) and the like are exemplary. The thicknesses of the free layer 51 and the magnetization pinned layer 53 are around 1 nm to 20 nm, respectively.

The nonmagnetic layer 52 is a spacer layer, and is an essential membrane for developing a tunnel magnetoresistance effect (TMR effect) or a giant magnetoresistive effect (GMR effect) to the MR multilayer body 50. As a material to compose the nonmagnetic layer 52, oxides, such as MgO, Mg—Al—O or Al—O, metallic materials, such as Cu, Au, Ag, Cr, Ag—Zn or Ni—Al, and the like are exemplary. Furthermore, the thickness of the nonmagnetic layer 52 is around 0.1 nm to 5 nm.

The antiferromagnetic layer 54 is composed by an antiferromagnetic material containing Mn and at least one type of element to be selected from a group of, for example, Pt, Ru, Rh, Pd, Ni, Cu, Jr, Cr and Fe. The content of Mn in this antiferromagnetic material is, for example, around 35 to 95 atom %. The antiferromagnetic layer 54 composed by the antiferromagnetic material fulfills the role of pinning the magnetization direction of the magnetization pinned layer 53 by exchange coupling with the magnetization pinned layer 53. Furthermore, without establishing the antiferromagnetic layer 54, the magnetization pinned layer 53 may have a three-layer structure of a first magnetization pinned layer, a nonmagnetic intermediate layer and a second magnetization pinned layer. The first magnetization pinned layer and the second magnetization pinned layer can be antiferromagnetically coupled via the nonmagnetic intermediate layer.

The plurality of upper-side lead electrodes 62 are placed on the plurality of MR multilayer bodies 50. Each upper-side lead electrode 62 has a long and narrow nearly-rectangular shape. The upper-side lead electrodes 62 are arranged to have a predetermined gap between two adjacent upper-side lead electrodes 62 in the electric series direction of the plurality of MR multilayer bodies 50 arranged in an array manner, and, to connect the plurality of MR multilayer bodies 50 in series, and electrically connect the antiferromagnetic layers 54 in the two adjacent MR multilayer bodies 50. Furthermore, the MR multilayer body 50 may have a structure where the antiferromagnetic layer 54, the magnetization pinned layer 53, the nonmagnetic layer 52 and the free layer 51 are laminated in respective order from the lower-side lead electrode 61 side. Further, a cap layer (protective layer) may be placed between the free layer 51 and the lower-side lead electrode 61 or the upper-side lead electrode 62. In the first embodiment, the soft magnetic body shield 12 is arranged above the upper-side lead electrode 62 where the MR multilayer body 50 is positioned.

In the MR multilayer body 50, a resistance value varies according to an angle between the magnetization direction of the free layer 51 and that of the magnetization pinned layer 53, and when this angle is 0° (these magnetization directions are in parallel with each other), the resistance value becomes minimum, and when this angle is 180° (the magnetization directions are antiparallel to each other), the resistance value becomes maximum.

As shown FIG. 1 and FIG. 1C, the MR element 11 has a nearly circular cylindrical shape, but the shape of the MR element 11 is not particularly limited and can be, for example, a hexagonal-column shape or the like to be described later. The size of the MR element 11 is not particularly limited, as well, but it can be appropriately set according to the size of an object to be detected, a positional relationship with an object to be detected or the like. Furthermore, in the explanation below, the diameter of the MR element 11 is set at $\varphi_m$.

The soft magnetic body shield 12 includes a soft magnetic material with small coercive force and high permeability and prevents the application of an external magnetic field with a magnetic field intensity that exceeds a predetermined range to the MR 11, if this characteristic is utilized. As the soft magnetic material, for example, a permalloy or the like that consists primarily of iron oxide, and that is a compound of ferrite, nickel and iron showing soft magnetic properties, are exemplified.

As shown in FIG. 1A and FIG. 1C, the soft magnetic body shield 12 has nearly a circular cylindrical shape, and has an upper surface and a lower surface, the shapes of which in a plan view are nearly the same size and are nearly circular. The shape of the soft magnetic body shield 12 in the first embodiment in the plan view should be nearly circular and is not limited to a true circle, but it is preferable to form the soft magnetic body shield 12 as a true circle to reduce unevenness of the distribution of the magnetic field intensity of the external magnetic field in the in-plane direction of the MR element 11. Furthermore, "true circle" here means a circle where $\varphi_b$ becomes 0.977 to 0.987 when lengths (diameters) of two straight lines that are mutually at right angles are defined as $\varphi_a$ and $\varphi_b$, and $\varphi_a$ is 1.

It is preferable that the diameter $\varphi_s$ of the soft magnetic body shield 12 in the plan view be set to fulfill the following formula (1) in the relationship with a diameter $\varphi_m$ of the MR element 11:

$$\varphi_s \geq 1.3\, \varphi_m \tag{1}$$

Because the soft magnetic body shield 12, in which the diameter $\varphi_s$ is 1.3 times of the diameter $\varphi_m$, is arranged above the MR element 11, the magnetic sensor 1, the size of which is such that the size of the MR element 11 can be physically included within the perimeter of the soft magnetic body shield 12 in a plan view, can be obtained. Furthermore, as shown in FIG. 1A and FIG. 1B, the central axis of the soft magnetic body shield 12 and that of the MR element 11 are adjusted to be the same, and the soft magnetic body shield 12 is arranged above the MR element 11. Furthermore, as long as the size of the MR element 11 is such that the MR element is physically included within the perimeter of the soft magnetic body shield 12, the soft magnetic body shield 12 should be arranged above the MR element 11, and for example, even when the central axes of both are deviated to a certain extent, these should be arranged to prevent the MR element 11 from straying from within the perimeter of the soft magnetic body shield 12 in a top view.

Figure 4:
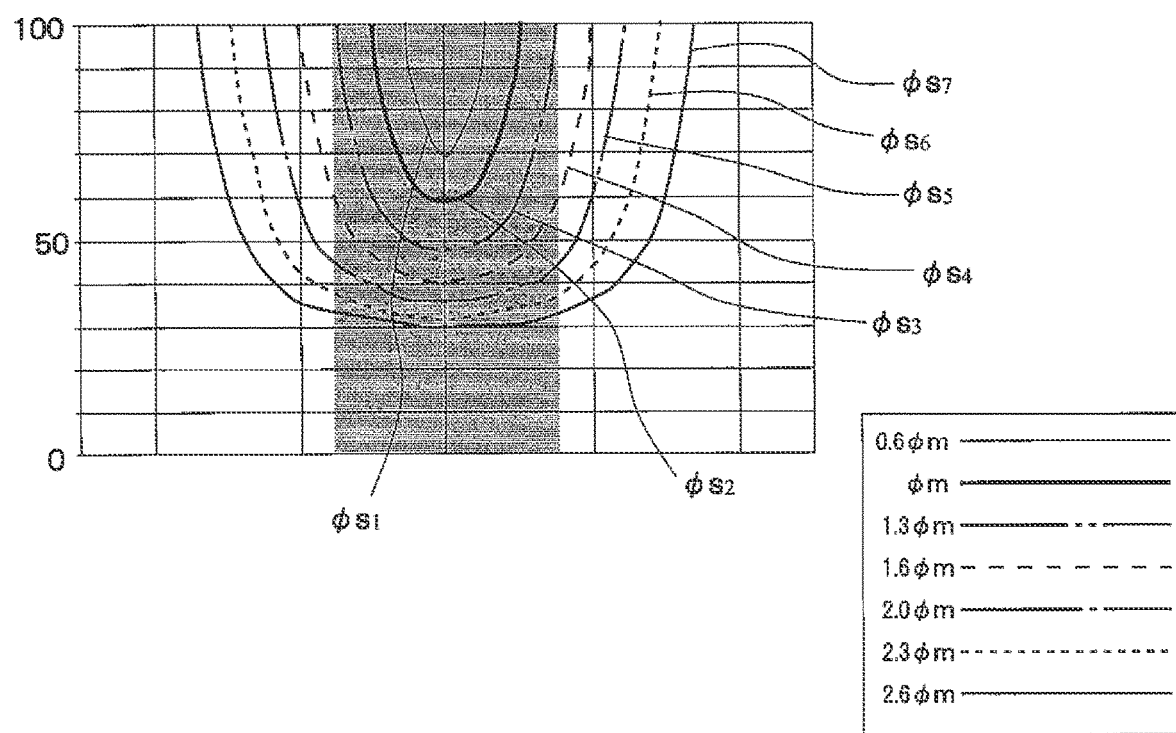
FIG. 4 is a characteristic chart showing characteristics where the attenuation effect of a magnetic field intensity to be applied to an MR element varies per diameter size of a soft magnetic body shield.

FIG. 4 is a characteristic chart, in the external magnetic field with 200 mT (Millitesla) of the magnetic field intensity, showing characteristics where the attenuation effect of the magnetic field intensity of an external magnetic field to be applied to the MR element 11 varies per diameter size of a soft magnetic body shield. In FIG. 4, the vertical axis indicates the magnetic field intensity and the horizontal axis indicates the position of the MR element 11, and the attenuation effects of the magnetic field intensities of the external magnetic field are indicated with curves protruding downward in the chart. The shaded portion in the chart indicates a position domain of the MR element 11. As described later, it is preferable that the magnetic field intensity of the external magnetic field to be applied to the MR element 11 be 20 to 80 mT. Consequently, as the attenuation effect of the magnetic field intensity by the soft magnetic body shield 12, it is preferable that the external magnetic field with 200 mT of the magnetic field intensity be attenuated to the range of 20 to 80 mT as mentioned above.

Here, a curve indicating a change of the magnetic field intensity of the external magnetic field in the case of using the soft magnetic body shield 12 having a diameter $\varphi_{s1}$, which is 0.6 times of the diameter $\varphi_m$ of the MR element 11, is indicated with a thin line; a curve indicating a change of the magnetic field intensity of the external magnetic field in the case of using the soft magnetic body shield 12 having a diameter $\varphi_{s2}$, which is same as the diameter $\varphi_m$ of the MR element 11, is indicated with a thick line; a curve indicating a change of the magnetic field intensity of the external magnetic field in the case of using the soft magnetic body shield 12 having a diameter $\varphi_{s3}$, which is 1.3 times of the diameter $\varphi_m$ of the MR element 11, is indicated with a two-dot chain line; a curve indicating a change of the magnetic field intensity of the external magnetic field in the case of using the soft magnetic body shield 12 having a diameter $\varphi_{s4}$, which is 1.6 times of the diameter $\varphi_m$ of the MR element 11, is indicated with a long dashed line; a curve indicating a change of the magnetic field intensity of the external magnetic field in the case of using the soft magnetic body shield 12 having a diameter $\varphi_{s5}$, which is 2.0 times of the diameter $\varphi_m$ of the MR element 11, is indicated with a dashed-dotted line; a curve indicating a change of the magnetic field intensity of the external magnetic field in the case of using the soft magnetic body shield 12 having a diameter $\varphi_{s6}$, which is 2.3 times of the diameter $\varphi_m$ of the MR element 11, is indicated with a broken line; and a curve indicating a change of the magnetic field intensity of the external magnetic field in the case of using the soft magnetic body shield 12 having a diameter $\varphi_{s7}$, which is 2.6 times the diameter $\varphi_m$ of the MR element 11, is indicated with a solid line.

As is clear from FIG. 4, it is preferable to use the soft magnetic body shield 12 with the diameter $\varphi_{s5}$ to the diameter $\varphi_{s7}$ where the magnetic field intensity of the external magnetic field is attenuated to the range of 20 to 80 mT as mentioned above. In other words, the diameter $\varphi_s$ of the soft magnetic body shield 12 is preferably 1.3 times or greater than the diameter $\varphi_m$ of the MR element 11, and more preferably 2.0 times or greater, and is further preferably 2.0 to 2.75 times greater. If the diameter $\varphi_s$ of the soft magnetic body shield 12 is less than 1.3 times of the $\varphi_m$ of the MR element 11, the flatness of the distribution of the magnetic field intensities of the external magnetic field in the in-plane direction of the MR element 11 is deteriorated, and it may become difficult to reduce error that is included in the detection angle by the magnetic sensor 1.

If the diameter $\varphi_s$ of the soft magnetic body shield 12 exceeds 2.75 times the diameter $\varphi_m$ of the MR element 11, when the plurality of the MR elements 11 are arranged in an array manner to be described later and the soft magnetic body shields 12 are arranged above the MR elements 11, respectively, the shield effect by the soft magnetic body shields 12 is liable to be reduced.

It is preferable to set thickness h of the soft magnetic body shield 12 to a magnitude that satisfies the following formula in the relationship with the diameter $\varphi_m$ of the MR element 11:

$$h > 0.3\ \varphi_m \quad (2)$$

If the thickness h of the soft magnetic body shield 12 is adjusted to exceed 0.3 times of the diameter $\varphi_m$ of the MR element 11, the attenuation effect of the magnetic field intensity of the external magnetic field can be further enhanced. Furthermore, the thickness h of the soft magnetic body shield 12 is not particularly limited, but even if this is increased, it is inferred that the excess thickness will not impair the performance of the magnetic sensor 1.

As shown in FIG. 1A to FIG. 1C, in the magnetic sensor 1 of the first embodiment, the soft magnetic body shield 12 is arranged above the MR element 11. In this case, the closer a distance d between the soft magnetic body shield 11 and the MR element 11 becomes, the higher the attenuation effect of the magnetic field intensity of the external magnetic field becomes, and the greater the distance d between the soft magnetic body shield 11 and the MR element 11 becomes, the lower the attenuation effect of the magnetic field intensity of the external magnetic field becomes. Consequently, the distance d between the soft magnetic body shield 12 and the MR element 11 can be appropriately set, for example, within 0.1 μm to 1 μm.

In the magnetic sensor 1 relating to the first embodiment, the soft magnetic body shield 12 having the distance and the thickness as mentioned above is arranged above the MR element 11. Consequently, the harmonic component $V_{3rd}$, which is included in the output signal from the MR element 11 in the case of applying the external magnetic field with the magnetic field intensity that exceeds 80 mT to the MR element 11, is nearly the same as the harmonic component $V_{3rd}$, which is included in the output signal in the case of applying the external magnetic field with the magnetic field intensity that is 80 mT or less to the MR element 11. Consequently, even if the external magnetic field with a magnetic field intensity that exceeds the detection range is applied to the MR element 11, the MR element 11 can output a desired detection signal, making it possible to prevent the positional detection error of an object from increasing.

Furthermore, the upper limit of the detection range of the magnetic field intensity is set at 80 mT, because the MR element 11 in the first embodiment is explained as a TMR element. In other words, 80 mT is a common upper limit value for the detection range in the case of using a TMR element as the MR element 11. Instead, a common upper limit value for the detection range in the case of using a GMR element as the MR element 11 is set at 70 mT. In this case, the magnetic sensor 1 is configured so that the harmonic component $V_{3rd}$, which is included in the output signal in the case of applying the external magnetic field with the magnetic field intensity that exceeds 70 mT to the MR element 11, become nearly the same as the harmonic component $V_{3rd}$, which is included in the output signal in the case of applying the external magnetic field with the magnetic field intensity that is 70 mT or less to the MR element 11.

Figure 5:
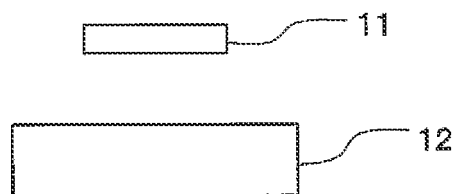
FIG. 5A is a schematic side view showing the variation of the magnetic sensor relating to the first embodiment of the present invention.
FIG. 5B is a schematic plan view showing another variation of the magnetic sensor relating to the first embodiment of the present invention.
FIG. 5C is a schematic side view showing another variation of the magnetic sensor relating to the first embodiment of the present invention.
Figure 5:
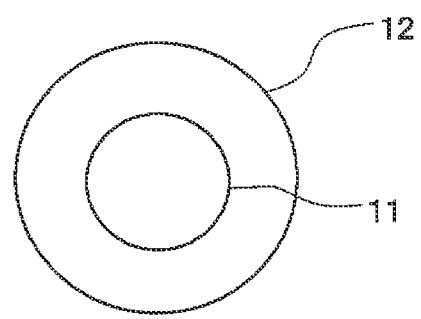
Figure 5:
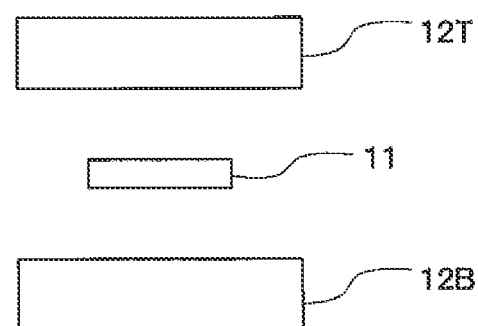

FIG. 5A is a schematic side view showing the variation of the magnetic sensor 1 relating to the first embodiment, and FIG. 5B is a schematic plan view of the magnetic sensor 1 relating to the variation. In the magnetic sensor 1 shown in FIG. 5A and FIG. 5B, the soft magnetic body shield 12 is arranged below the MR element 11. In this point, the magnetic sensor 1 shown in FIG. 5A and FIG. 5B is different from the magnetic sensor 1 shown in FIG. 1A to FIG. 1C. Even in the magnetic sensor 1 shown in FIG. 5A and FIG. 5B, the size of the MR element 11 is a size that is physically included within the perimeter of the soft magnetic body shield 12, in a plan view.

FIG. 5C is a schematic side view showing a magnetic sensor 1 having a different configuration from the magnetic sensor 1 shown in FIG. 1A to FIG. 1C and FIG. 5A to FIG. 5B, as a variation of the magnetic sensor relating to the first embodiment. In the magnetic sensor 1 shown in FIG. 5C, soft magnetic body shields 12T and 12B are arranged above and below the MR element 11, respectively. In this point, the magnetic sensor 1 shown in FIG. 5C is different from the magnetic sensor 1 shown in FIG. 1A to FIG. 1C and the magnetic sensor 1 shown in FIG. 5A to FIG. 5B. Even in the magnetic sensor 1 shown in FIG. 5C, the size of the MR element 11 is a size that is physically included within the perimeter of the soft magnetic body shields 12T and 12B in a plan view.

In other words, even in the variations shown in FIG. 5A to FIG. 5C, because the magnetic sensor 1 is configured such that the size of the MR element 11 is adjusted to a size that is physically included within the perimeter of the soft magnetic body shield 12 in a plan view, even if the external magnetic field with the magnetic field intensity that exceeds the detection range is applied to the MR element 11, it becomes possible to prevent an increase of an error in position detection an object as is similar to the magnetic sensor 1 shown in FIG. 1A to FIG. 1C.

Figure 6:
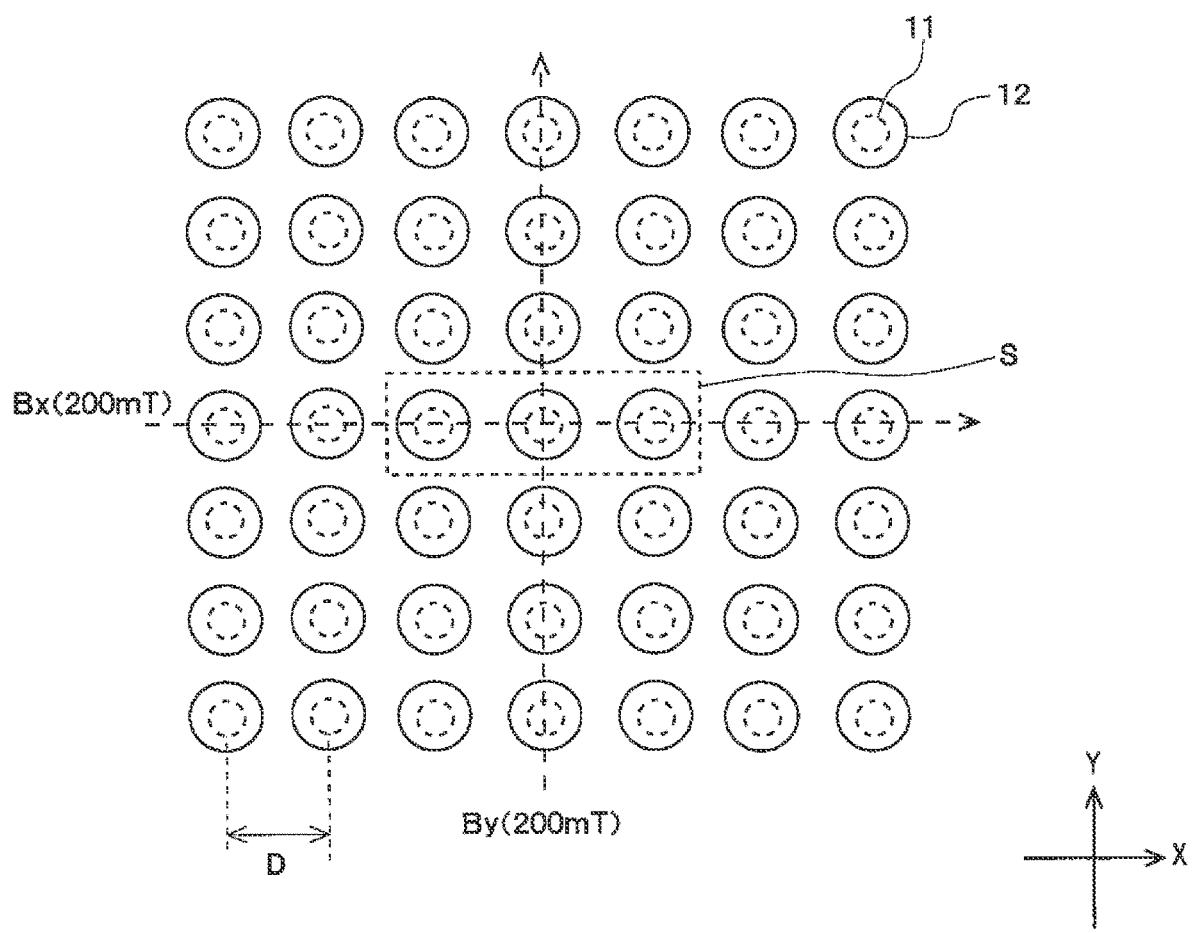
FIG. 6 is a schematic plan view showing the magnetic sensor where a plurality of MR elements, where a soft magnetic body shield is arranged above, respectively, relating to the first embodiment of the present invention are arranged in an array manner.

FIG. 6 is a schematic plan view showing the magnetic sensor 1 where a plurality of MR elements 11, where the soft magnetic body shields are arranged above, respectively, are arranged in an array manner. In FIG. 6, the magnetic sensor 1 where the MR elements 11 indicated by a broken line are arranged in 7 lines×7 rows, and where the soft magnetic body shields 12 are arranged in 7 lines×7 rows above (at a viewer side in the drawing) by corresponding to the MR elements 11, respectively, is shown, but the configuration of the magnetic sensor 1 is not limited to the one mentioned above but a configuration where size, shape and the like of an object to be detected are considered can be appropriately set. Further, in FIG. 6, a gap between mutually-adjacent soft magnetic body shields 12 (MR elements 11) is indicated by the symbol D. Furthermore, to confirm the attenuation effect of the magnetic field intensity, as indicated by the broken line Bx in FIG. 6, the magnetic field intensity of the external magnetic field is set at 200 mT and the magnetic field intensity is measured along the seven MR elements 11 aligned in the X-axis direction; and as indicated with a broken line By in FIG. 6, the magnetic field intensity is measured along the seven MR elements 11 aligned in the Y-axis direction.

Figure 7:
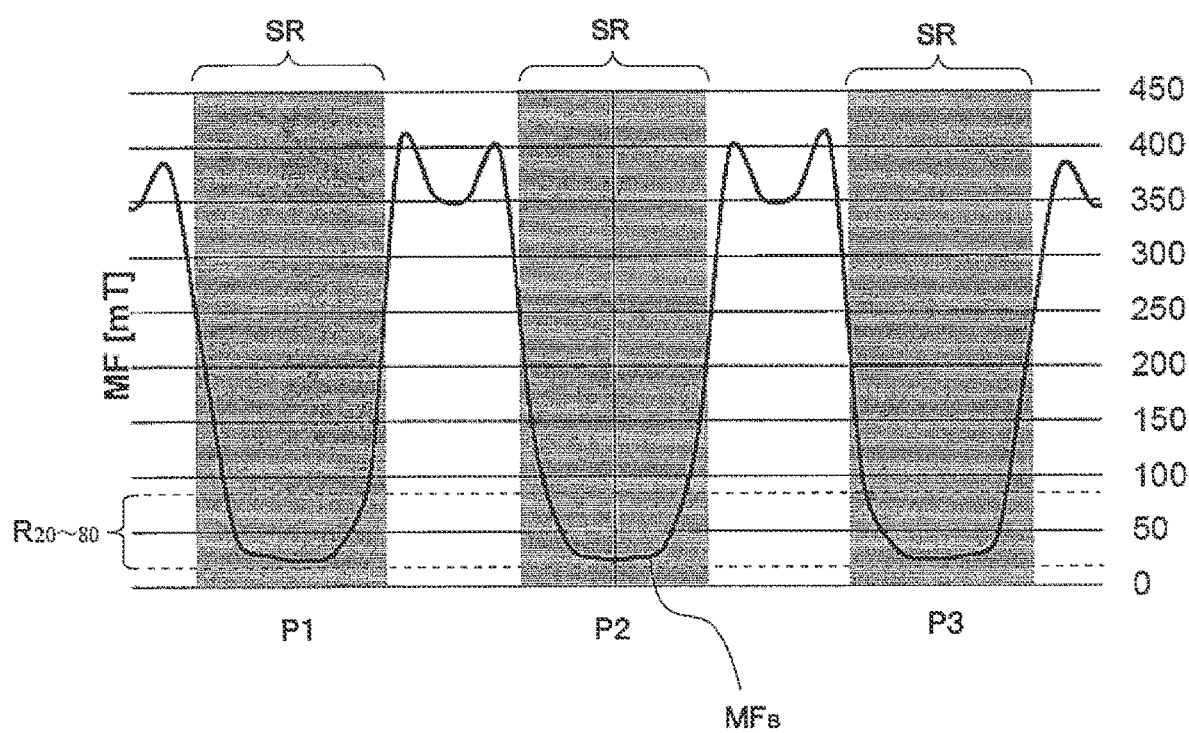
FIG. 7 is a characteristic chart showing an attenuation of effect of the magnetic field intensity in the magnetic sensor shown in FIG. 6.

FIG. 7 is a characteristic chart showing one example of an attenuation effect of the magnetic field intensity in the magnetic sensor 1 shown in FIG. 6, and the attenuation effect of the magnetic field intensity in the three MR elements 11 surrounded with a broken line S in FIG. 6 is indicated with a curve $MF_B$. In FIG. 7, shield regions SR of the soft magnetic body shields 12 are indicated with shaded lines. The attenuation effect of the magnetic field intensity here is confirmed by drawing measurements of the magnetic field intensities in the X-axis direction for seven MR elements 11 aligned in a single horizontal row including three MR elements 11 onto a graph where the horizontal axis indicates positions of the MR elements 11 and the vertical axis indicates the magnetic field intensities. As shown in FIG. 7, it is preferable that the magnetic field intensities at positions P1, P2 and P3 of the three MR elements 11 are attenuated to 20 to 80 mT of the detection range, as the attenuation effect (external magnetic field intensity: 200 mT) of the magnetic field intensities in the case of setting the diameter $\varphi_s$ of the soft magnetic body shield 12 to twice the diameter $\varphi_m$ of the MR elements 11. Further, as shown in FIG. 7, it is preferable that the distribution of the magnetic field intensities is substantially flat at element portions (P1, P2 and P3) covered with the shield regions SR.

Second Embodiment

Figure 8:
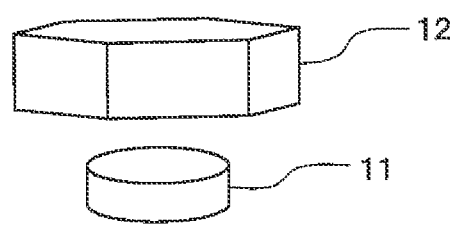
FIG. 8A is an entire schematic perspective view showing a magnetic sensor relating to the second embodiment of the present invention.
FIG. 8B is a schematic side view showing the magnetic sensor relating to the second embodiment of the present invention.
Figure 8:
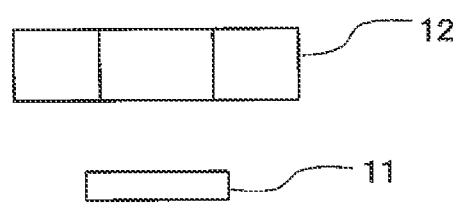

FIG. 8A is an entire schematic perspective view showing the magnetic sensor 1 relating to the second embodiment of the present invention, and FIG. 8B is a schematic side view showing the magnetic sensor 1 relating to the second embodiment of the present invention. Furthermore, the configuration that is nearly similar to that of the magnetic sensor 1 in the first embodiment is marked with the same symbols and its detailed explanation is omitted.

As shown in FIG. 8A and FIG. 8B, the soft magnetic body shield 12 configuring the magnetic sensor 1 relating to the second embodiment has a hexagonal-column shape. Furthermore, the shape of the soft magnetic body shield 12 configuring the magnetic sensor 1 is not limited to the hexagonal-column shape, but any shape is acceptable as long as the shape is a polygonal column with N sides (N is 6 or greater even number) of its plan view shape, such as an octagonal pillar, a dodecagonal pillar or a hexadecagonal pillar. Further, it is preferable that the shape of the soft magnetic body shield 12 configuring the magnetic sensor 1 be a polygonal column with N sides with M-fold symmetrical shape (M is four or greater even number) that overlaps with itself when this is rotated by a predetermined angle around the central axis in the plan view. If the soft magnetic body shield 12 is a polygonal column with N sides (N is 6 or greater even number) including a hexagonal shape in the plan view, and is preferably columnar with a polygon with N sides with an M-fold symmetrical shape (M is four or greater even number) in the plan view, it becomes possible to reduce the unevenness in the distribution of the magnetic field intensities of the external magnetic field in the in-plane direction of the MR element 11.

Because the soft magnetic body shield 12 in the second embodiment is arranged above or below the MR element 11 as is similar to the first embodiment, even if the external magnetic field with the magnetic field intensity that exceeds the detection range (for example, 80 mT or greater) is applied to the MR element 11, the harmonic component $V_{3rd}$, which is included in the output signal from the MR element 11, becomes nearly the same as the harmonic component $V_{3rd}$, which is included in the output signal when the external magnetic field with 80 mT or less of the magnetic field intensity is applied to the MR element 11. Consequently, the MR element 11 can output a desired detection signal, and it becomes possible to prevent the positional detection error of an object from increasing.

Third Embodiment

Figure 9:
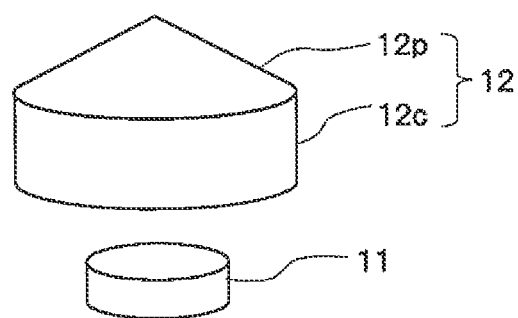
FIG. 9A is an entire schematic perspective view showing a magnetic sensor relating to the third embodiment of the present invention.
FIG. 9B is a schematic side view showing the magnetic sensor relating to the third embodiment of the present invention.
Figure 9:
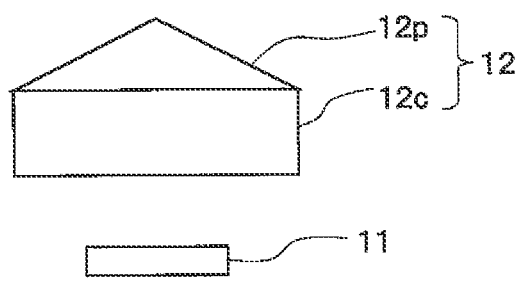

FIG. 9A is an entire schematic perspective view showing the magnetic sensor 1 relating to the third embodiment of the present invention, and FIG. 9B is a schematic side view showing the magnetic sensor 1 relating to the third embodiment of the present invention. Furthermore, the configuration that is nearly similar to that of the magnetic sensor 1 in the first embodiment is marked with the same symbols and its detailed explanation is omitted.

As shown in FIG. 9A and FIG. 9B, the soft magnetic body shield 12 configuring the magnetic sensor 1 relating to the third embodiment has shape in which a conical portion 12p is positioned on a columnar portion 12c that is circular in a plan view. The shape of the soft magnetic body shield 12 is not limited to the shape above, but can be a shape having a convexity where at least a portion of the upper surface of the columnar portion 12c protrudes. As the shape of the soft magnetic body shield 12, for example, a shape can be appropriately set in which a small columnar portion (convexity), which has a smaller diameter and thickness than those of the columnar portion 12c, is positioned on the columnar portion 12c. Furthermore, the shape of the soft magnetic body shield 12, is not limited to the columnar portion 12c above, but a pillar portion, for example, in a polygon with N sides (N is 6 or greater even number), such as a hexagonal prism, and preferably a polygon with N sides with an M-fold symmetrical shape (M is four or greater even number) and the like can be appropriately set. Further, the shape of the soft magnetic body shield 12 is not limited to the conical portion 12p, but a convexity, for example, an N-sided pyramid (N is 6 or greater even number), such as a hexagonal pyramid, preferably an N-sided pyramid with an M-fold symmetrical shape (M is four or greater even number) in the plan view and the like can be appropriately set. In the magnetic sensor 1 relating to the third embodiment, from a viewpoint to enjoy the attenuation effect of the magnetic field intensity of the external magnetic field as is similar to the first embodiment, both the MR element 11 and the soft magnetic body shield 12 can be arranged to face the upper surface of the MR element 11 and the nearly-flat lower surface (the conical portion 12p, a surface at the side facing the small columnar portion (convexity)) of the soft magnetic body shield 12.

Because the soft magnetic body shield 12 relating to the third embodiment is arranged above the MR element 11, even though the external magnetic field with the magnetic field intensity that exceeds a detection range (for example, exceeding 80 mT) is applied to the MR element 11, the harmonic component $V_{3rd}$, which is included in the output signal from the MR element 11, becomes nearly the same as the harmonic component $V_{3rd}$, which is included in the output signal in the case of applying the external magnetic field with 80 mT or less of the magnetic field intensity to the MR element 11. Consequently, the MR element 11 can output a desired detection signal, making it possible to prevent an increase of an error in position detection of an object.

Fourth Embodiment

Figure 10:
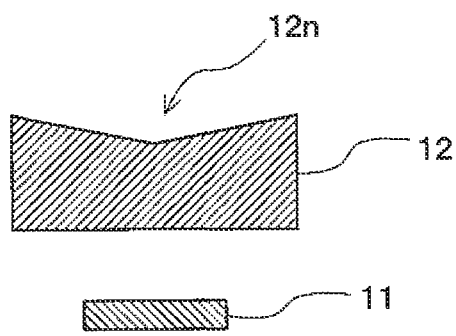
FIG. 10 is an entire schematic cross-sectional view showing a magnetic sensor relating to the fourth embodiment of the present invention.

FIG. 10 is an entire schematic cross-sectional view showing the magnetic sensor 1 relating to the fourth embodiment of the present invention. Furthermore, the configuration that is nearly similar to that of the magnetic sensor 1 in the first embodiment is marked with the same symbols and its detailed explanation is omitted.

As shown in FIG. 10, a mortar-shaped portion 12n where its upper surface is indented toward the lower surface side to be mortar-shaped is formed in the soft magnetic body shield 12 configuring the magnetic sensor 1 relating to the fourth embodiment. Furthermore, the form where the upper surface of the soft magnetic body shield 12 is indented toward the lower surface side is not limited to being mortar-shaped, but another form where at least a portion of the upper surface of the soft magnetic body shield 12 is indented toward the lower surface (concave portion) is also acceptable. The form of the soft magnetic body shield 12 can be appropriately set as, for example, a form in which a portion of the upper surface of the soft magnetic body shield 12 is indented toward the lower portion side by a nearly-cylindrical spatial portion with a smaller diameter than the diameter $\varphi_s$ of the soft magnetic body shield 12 and with a thickness that is thinner than that of the soft magnetic body shield 12.

From a similar viewpoint to that of the third embodiment, the MR element 11 and the soft magnetic body shield 12 can be arranged to face the upper surface of the MR element 11 and the nearly-flat lower surface (mortar-shaped portion 12n, a plane at the side of facing the concave portion) of the soft magnetic body shield 12. Because the soft magnetic body shield 12 relating to the fourth embodiment is arranged above the MR element 11, even if the external magnetic field with the magnetic field intensity that exceeds the detection range (for example, exceeding 80 mT) is applied to the MR element 11, the harmonic component $V_{3rd}$, which is included in the output signal from the MR element 11, becomes nearly the same as the harmonic component $V_{3rd}$, which is included in the output signal in the case of applying the external magnetic field with 80 mT or less of the magnetic field intensity to the MR element 11. Consequently, the MR element 11 can output the desired detection signal, and it becomes possible to prevent an increase of an error in position detection of an object.

Fifth Embodiment

Figure 11A:
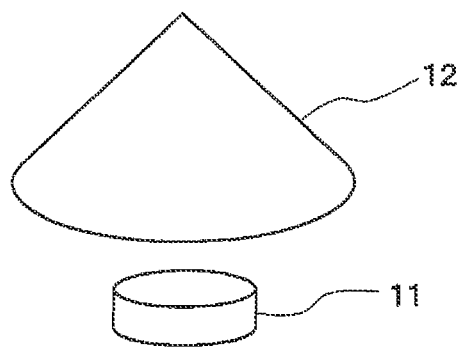
FIG. 11A is an entire schematic perspective view showing a magnetic sensor relating to the fifth embodiment of the present invention.
Figure 11B:
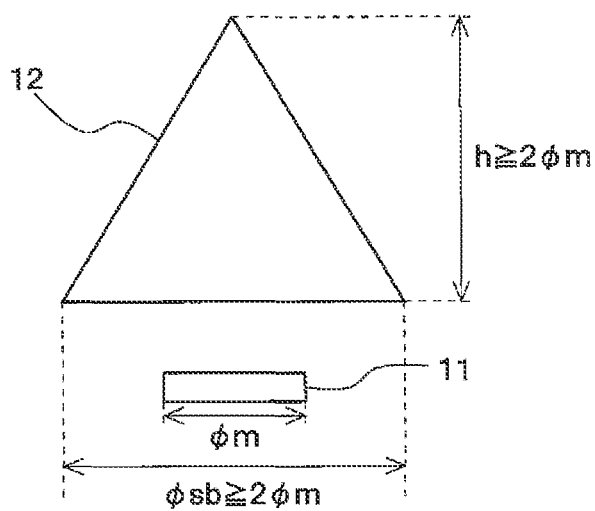
FIG. 11B is a schematic side view showing the magnetic sensor relating to the fifth embodiment of the present invention.

FIG. 11A is an entire schematic perspective view showing the magnetic sensor 1 relating to the fifth embodiment of the present invention; and FIG. 11B is a schematic side view showing the magnetic sensor 1 relating to the fifth embodiment of the present invention. Furthermore, the configuration that is nearly similar to that of the magnetic sensor 1 in the first embodiment is marked with the same symbols and its detailed explanation is omitted.

As shown in FIG. 11A and FIG. 11B, the soft magnetic body shield 12 configuring the magnetic sensor 1 relating to the fifth embodiment has a nearly conical shape. Furthermore, the shape of the soft magnetic body shield 12 is not limited to the nearly-conical shape, but it should be an N-sided pyramid (N is 6 or greater even number), such as a hexagonal pyramid, an eight-sided pyramid, a twelve-sided pyramid or a sixteen-sided pyramid, and should preferably be an N-sided pyramid with M-fold symmetrical shape (M is four or greater even number). Here, as an example of the N-sided pyramid, the shape where N is 6 or greater of even number is according to the similar reason to the case of the hexagonal-column shape of soft magnetic body shield 12 in the second embodiment.

In the fifth embodiment, because the soft magnetic body shield 12 is nearly conical, a shieldable region (a region where a magnetic shield effect proves effective in a plan view) is narrower than an area of the soft magnetic body shield 12 in the plan view, one with a relatively larger size compared to, for example, the nearly columnar soft magnetic body shield 12 in the first embodiment can be set to secure the sufficient shieldable region. For example, as shown in FIG. 11B, as the size of the soft magnetic body shield 12 relating to the fifth embodiment, it is preferable that the thickness from the bottom surface be 2 φm or greater and the diameter φsb of the bottom surface be 2 φm or greater. Further, even in the soft magnetic body shield 12 relating to the fifth embodiment, the MR element 11 and the soft magnetic body shield 12 can be arranged to face the upper surface of the MR element and the lower surface of the soft magnetic body shield 12 from the similar viewpoint of the third embodiment and fourth embodiment.

Because the soft magnetic body shield 12 relating to the fifth embodiment is arranged above the MR element 11, even if the external magnetic field with the magnetic field intensity that exceeds the detection range (for example, exceeding 80 mT) is applied to the MR element 11, the harmonic component $V_{3rd}$, which is included in the output signal from the MR element 11, becomes nearly the same as the harmonic component $V_{3rd}$, which is included in the output signal when the external magnetic field with 80 mT or less of the magnetic field intensity is applied to the MR element 11. Consequently, the MR element 11 can output the desired detection signal, making it possible to prevent an increase of an error in position detection of an object.

Sixth Embodiment

FIG. 12A is an entire schematic perspective view showing the magnetic sensor 1 relating to the sixth embodiment of the present invention; and FIG. 12B is a schematic cross-sectional view showing the magnetic sensor 1 relating to the sixth embodiment of the present invention. Furthermore, the configuration that is nearly similar to that of the magnetic sensor 1 in the first embodiment is marked with the same symbols and its detailed explanation is omitted.

As shown in FIG. 12A and FIG. 12B, the soft magnetic body shield 12 configuring the magnetic sensor 1 relating to the sixth embodiment has a nearly circular cylindrical shape similar to that of the first embodiment, but is different from the soft magnetic body shield 12 relating to the first embodiment because a through-hole 12h penetrates through the central axis in the thickness direction is formed. The depth h of the through-hole 12h is equivalent to the thickness of the soft magnetic body shield 12. In the Sixth Embodiment, a diameter Wh and the depth h of the through-hole 12h can be adjusted to reduce unevenness of the distribution of the magnetic field intensities of the external magnetic field in the in-plane direction of the MR element 11. The diameter Wh of the through-hole 12h can be appropriately set to 0.03 $\varphi_m$ or less.

Because the soft magnetic body shield 12 relating to the sixth embodiment is arranged above or below the MR element 11 as similar to the first embodiment, even if the external magnetic field with the magnetic field intensity exceeding the detection range (for example, exceeding 80 mT) is applied to the MR element 11, the harmonic component $V_{3rd}$, which is included in the output signal from the MR element 11, becomes nearly the same as the harmonic component $V_{3rd}$, which is included in the output signal when the external magnetic field with 80 mT or less of the magnetic field intensity is applied to the MR element 11. Consequently, the MR element 11 can output the desired detection signal, making it possible to prevent an increase of an error in position detection of an object.

The embodiments explained above are described to facilitate the understanding of the present invention, but are not described to restrict the present invention. Therefore, elements disclosed in the embodiments above are a concept to include all their design changes and equivalents belonging to the technical scope of the present invention.

In the embodiments above, the MR elements, the TMR element and GMR element having a lamination film structure were exemplified, but the present invention shall not be limited to such modes, and for example, an AMR element having a single film structure of an antiferromagnetic material is also acceptable.

EXAMPLES

The present invention is explained in further detail hereafter by exemplifying examples and the like, but the present invention should be limited to such examples and the like at all.

Example 1

Figure 13:
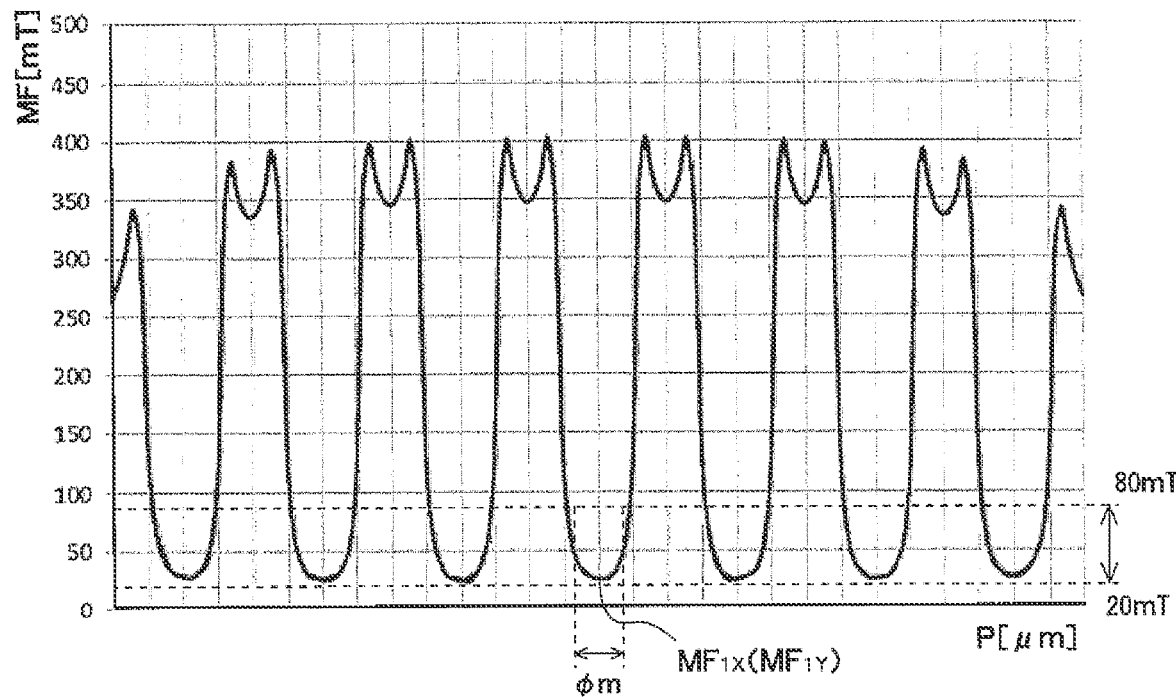
FIG. 13 is a characteristic chart showing an attenuation effect of a magnetic field intensity to be applied to the MR element in the case of using a soft magnetic body shield of Example 1.

As the magnetic sensor 1 having the configurations shown in FIG. 1A to FIG. 1C, the magnetic sensor 1 was prepared where a plurality of the MR elements 11, where the soft magnetic body shields 12 were arranged above, were arranged in an array manner. In such magnetic sensor 1, the diameter of the nearly-cylindrical MR element 11 was set at $\varphi_m$, the diameter $\varphi_s$ of the nearly-cylindrical soft magnetic body shield 12 was set at 2.0 $\varphi_m$ and the thickness h was set at $\varphi_m$, and the soft magnetic body shields 12 were arranged immediately above the MR elements 11, the arrangement interval between the MR element 11 and the soft magnetic body shield 12 was set at 0.075 $\varphi_m$, and the interval D between the two adjacent soft magnetic body shields 12 (the MR elements 11) was set at 3.3 $\varphi_m$. An attenuation effect was confirmed based upon a curve $MF_{1X}$ that was obtained by measuring the magnetic field intensity along the MR elements 11 aligned in the X-axis direction and $MF_{1Y}$ that was obtained by measuring the magnetic field intensity along the MR elements 11 aligned in the Y-axis direction in the case of applying 200 mT of an external magnetic field to the magnetic sensor 1 in Example 1 (see FIG. 6). The results are shown in Table 1 and FIG. 13. Furthermore, in the characteristic charts shown in FIGS. 14 to 26, FIG. 27B, FIG. 28B and FIG. 29 to be explained hereafter, the vertical axis indicates a magnetic field intensity MF (unit: mT) and the horizontal axis indicates a position P (unit: μm) of the MR element 11, and the diameter φm of the MR element 11 is indicated with a width (two-way arrow) interposed with broken lines extending from the horizontal axis in the vertical direction. In Example 1, since the magnetic field intensities that were measured along the MR elements 11 aligned in the X-axis direction and those that were measured along the MR elements 11 aligned in the Y-axis direction are nearly the same, the curve $MF_{1X}$ and the curve $MF_{1Y}$ are depicted to be nearly overlapped (FIG. 13). Furthermore, a benchmark to assess the attenuation effect of the magnetic field intensity was shown as "○", "Δ" and "x" as mentioned below.

[Benchmark to Assess Attenuation Effect]

○: The magnetic field intensity of the external magnetic field to be applied to the MR element 11 remains generally within 20 to 80 mT.

Δ: Even though the magnetic field intensity of the external magnetic field to be applied to the MR element 11 is partially off 20 to 80 mT, or the flatness of the magnetic field intensity distribution within the plane of the MR element 11 is decreased, the result has reached the standard without any problem in practical use.

x: Most of the magnetic field intensity of the external magnetic field to be applied to the MR element 11 is off 20 to 80 mT, or the flatness of the magnetic field intensity distribution within the plane of the MR element 11 is remarkably deteriorated.

Example 2

Figure 14:
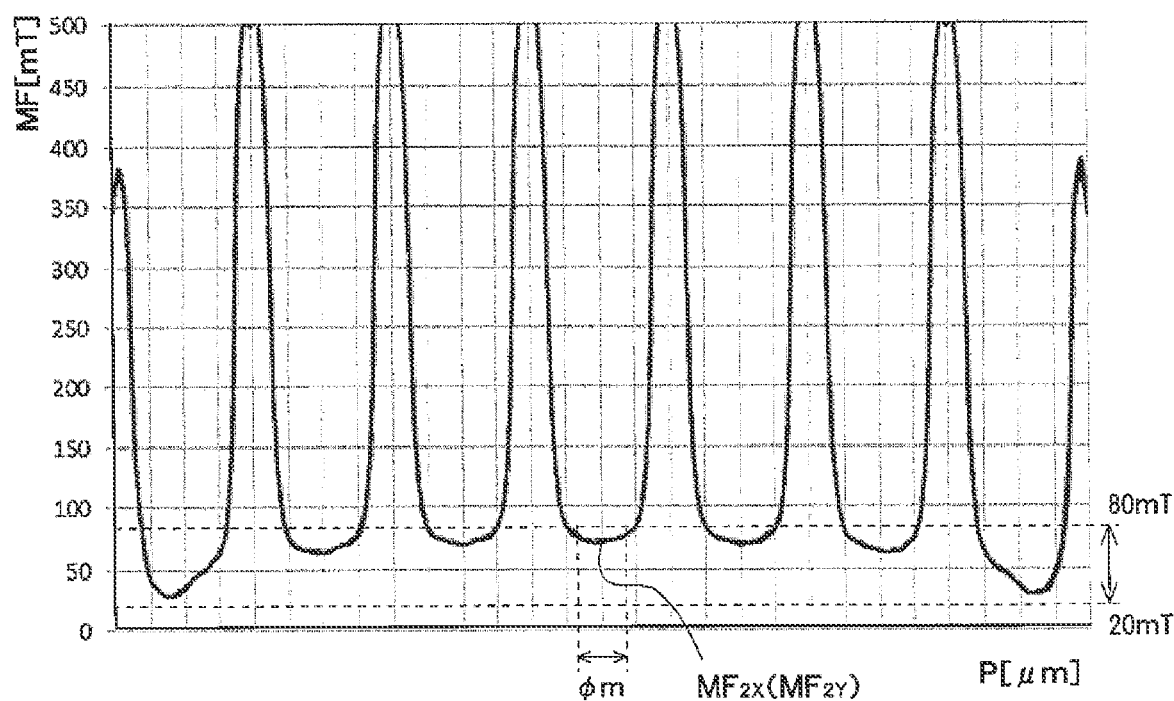
FIG. 14 is a characteristic chart showing an attenuation effect of a magnetic field intensity to be applied to the MR element in the case of using a soft magnetic body shield of Example 2.
Figure 1:
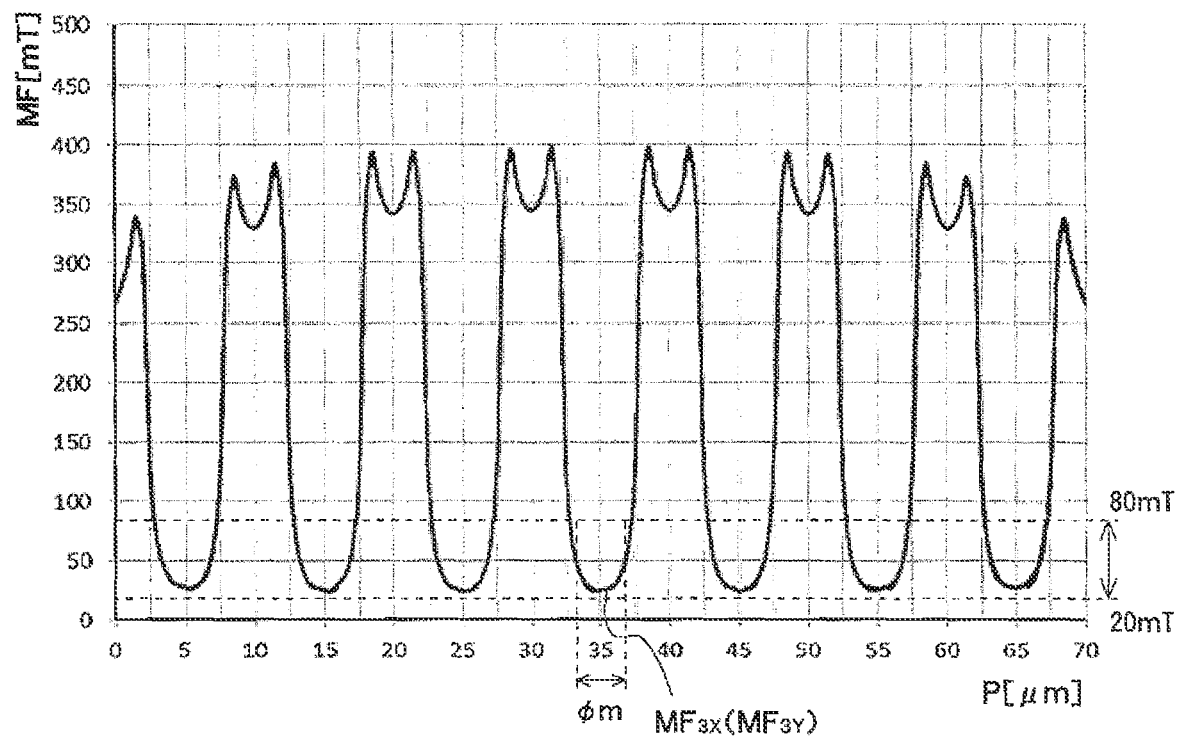
Figure 1:
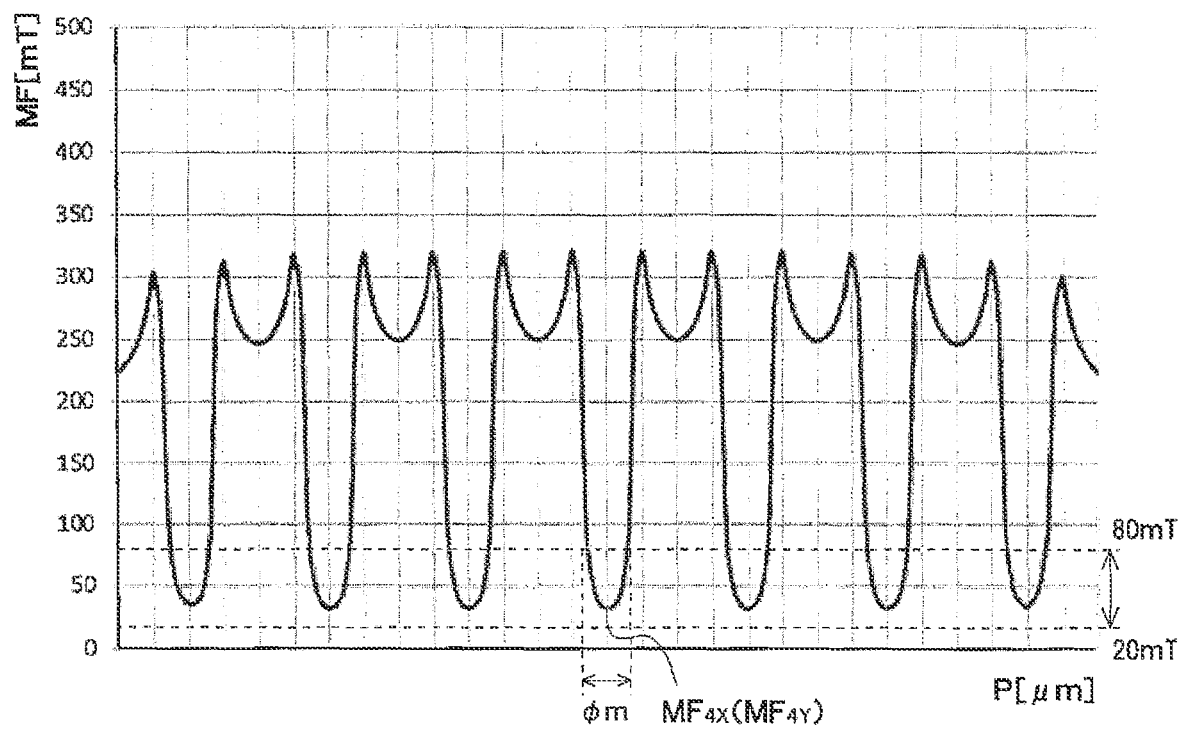

The magnetic sensor 1 having the similar configuration to Example 1, except for setting the diameter $\varphi_s$ of the soft magnetic body shield 12 at 2.6 $\varphi_m$, was prepared. An attenuation effect was confirmed based upon a curve $MF_{2X}$ that was obtained by measuring the magnetic field intensity along the MR elements 11 aligned in the X-axis direction and $MF_{2Y}$ that was obtained by measuring the magnetic field intensity along the MR elements 11 aligned in the Y-axis direction in the case of applying 200 mT of an external magnetic field to the magnetic sensor 1 in Example 2. The results are shown in Table 1 and FIG. 14. In Example 2, the magnetic field intensities that were measured along the MR elements 11 aligned in the X-axis direction and those that were measured along the MR elements 11 aligned in the Y-axis direction are nearly the same, and the curve $MF_{2X}$ and the curve $MF_{2Y}$ are depicted to be nearly overlapped (FIG. 14).

Example 3

The magnetic sensor 1 having the similar configuration to Example 1, except for setting the thickness h of the soft magnetic body shield 12 at 1.6 $\varphi_m$, was prepared. An attenuation effect was confirmed based upon a curve $MF_{3X}$ that was obtained by measuring the magnetic field intensity along the MR elements 11 aligned in the X-axis direction and $MF_{3Y}$ that was obtained by measuring the magnetic field intensity along the MR elements 11 aligned in the Y-axis direction in the case of applying 200 mT of an external magnetic field to the magnetic sensor 1 in Example 3. The results are shown in Table 1 and FIG. 15. In Example 3, since the magnetic field intensities that were measured along the MR elements 11 aligned in the X-axis direction and those that were measured along the MR elements 11 aligned in the Y-axis direction are nearly the same, the curve $MF_{3X}$ and the curve $MF_{3Y}$ are depicted to nearly overlap (FIG. 15).

Example 4

The magnetic sensor 1 having the similar configuration to Example 1, except for setting the thickness h of the soft magnetic body shield 12 at 1.3 $\varphi_m$, was prepared. An attenuation effect was confirmed based upon a curve $MF_{4X}$ that was obtained by measuring the magnetic field intensity along the MR elements 11 aligned in the X-axis direction and $MF_{4Y}$ that was obtained by measuring the magnetic field intensity along the MR elements 11 aligned in the Y-axis direction in the case of applying 200 mT of an external magnetic field to the magnetic sensor 1 in Example 4. The results are shown in Table 1 and FIG. 16. In Example 4, since the magnetic field intensities that were measured along the MR elements 11 aligned in the X-axis direction and those that were measured along the MR elements 11 aligned in the Y-axis direction are nearly the same, the curve $MF_{4X}$ and the curve $MF_{4Y}$ are depicted to nearly overlap (FIG. 16).

Example 5

Figure 17:
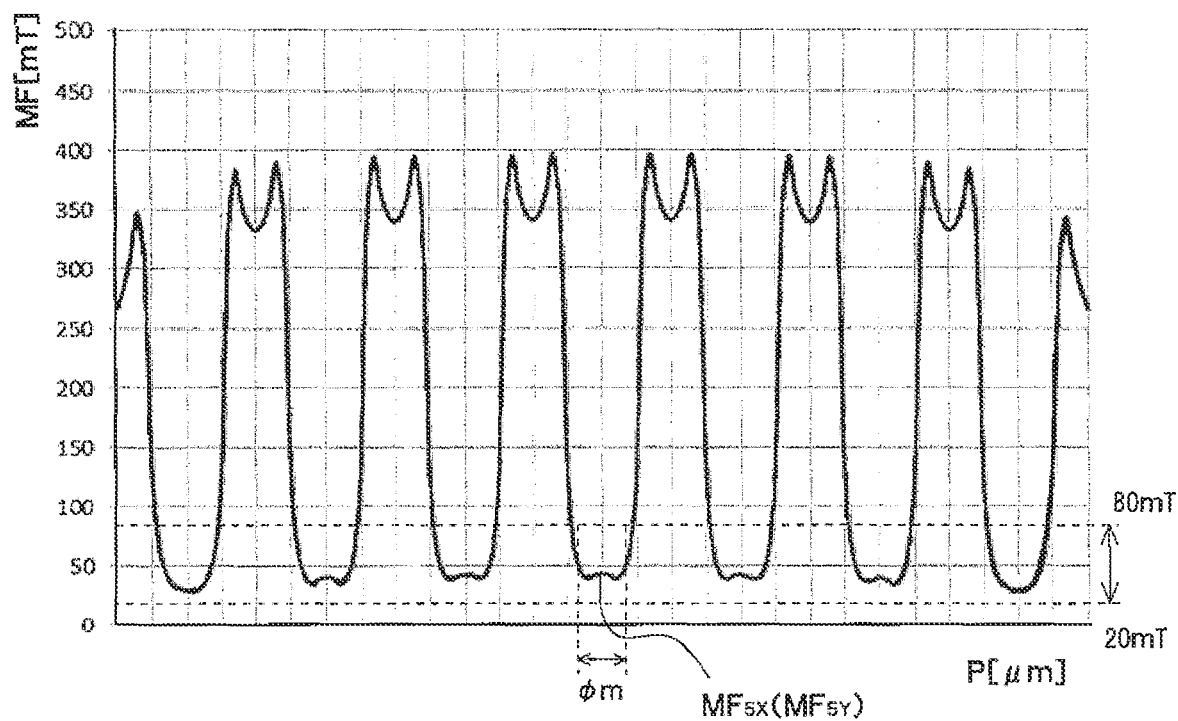
FIG. 17 is a characteristic chart showing an attenuation effect of a magnetic field intensity to be applied to the MR element in the case of using a soft magnetic body shield of Example 5.

The magnetic sensor 1 having the similar configuration to Example 1, except for setting the thickness h of the soft magnetic body shield 12 at 0.8 $\varphi_m$, was prepared. An attenuation effect was confirmed based upon a curve $MF_{5X}$ that was obtained by measuring the magnetic field intensity along the MR elements 11 aligned in the X-axis direction and $MF_{5Y}$ that was obtained by measuring the magnetic field intensity along the MR elements 11 aligned in the Y-axis direction in the case of applying 200 mT of an external magnetic field to the magnetic sensor 1 in Example 5. The results are shown in Table 1 and FIG. 17. In Example 5, since the magnetic field intensities that were measured along the MR elements 11 aligned in the X-axis direction and those that were measured along the MR elements 11 aligned in the Y-axis direction are nearly the same, the curve $MF_{5X}$ and the curve $MF_{5Y}$ are depicted to nearly overlap (FIG. 17).

Example 6

Figure 18:
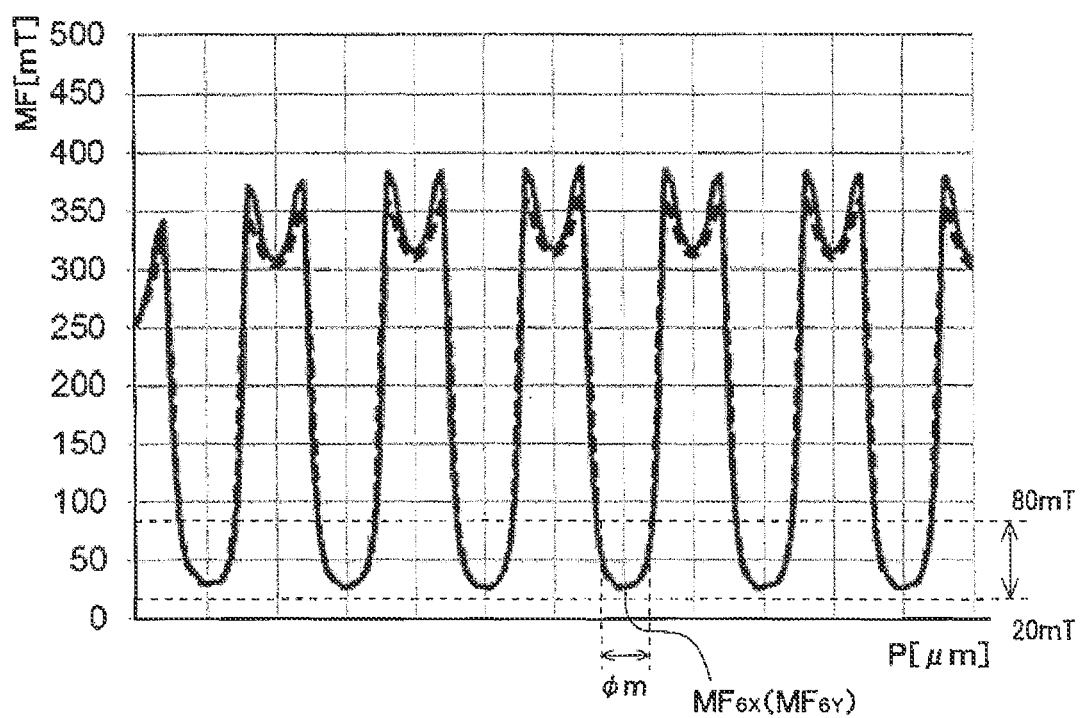
FIG. 18 is a characteristic chart showing an attenuation effect of a magnetic field intensity to be applied to the MR element in the case of using a soft magnetic body shield of Example 6.

The magnetic sensor 1 having the similar configuration to Example 1, except for setting the configuration shown in FIG. 8A to FIG. 8B, i.e., setting the shape of the soft magnetic body shield 12 to be a hexagonal prism, was prepared. An attenuation effect was confirmed based upon a curve $MF_{6X}$ that was obtained by measuring the magnetic field intensity along the MR elements 11 aligned in the X-axis direction and $MF_{6Y}$ that was obtained by measuring the magnetic field intensity along the MR elements 11 aligned in the Y-axis direction in the case of applying 200 mT of an external magnetic field to the magnetic sensor 1 in Example 6. The results are shown in Table 1 and FIG. 18. In Example 6, since the magnetic field intensities that were measured along the MR elements 11 aligned in the X-axis direction and those that were measured along the MR elements 11 aligned in the Y-axis direction are nearly the same, the curve $MF_{6X}$ and the curve $MF_{6Y}$ are depicted to nearly overlap (FIG. 18).

Example 7

Figure 19:
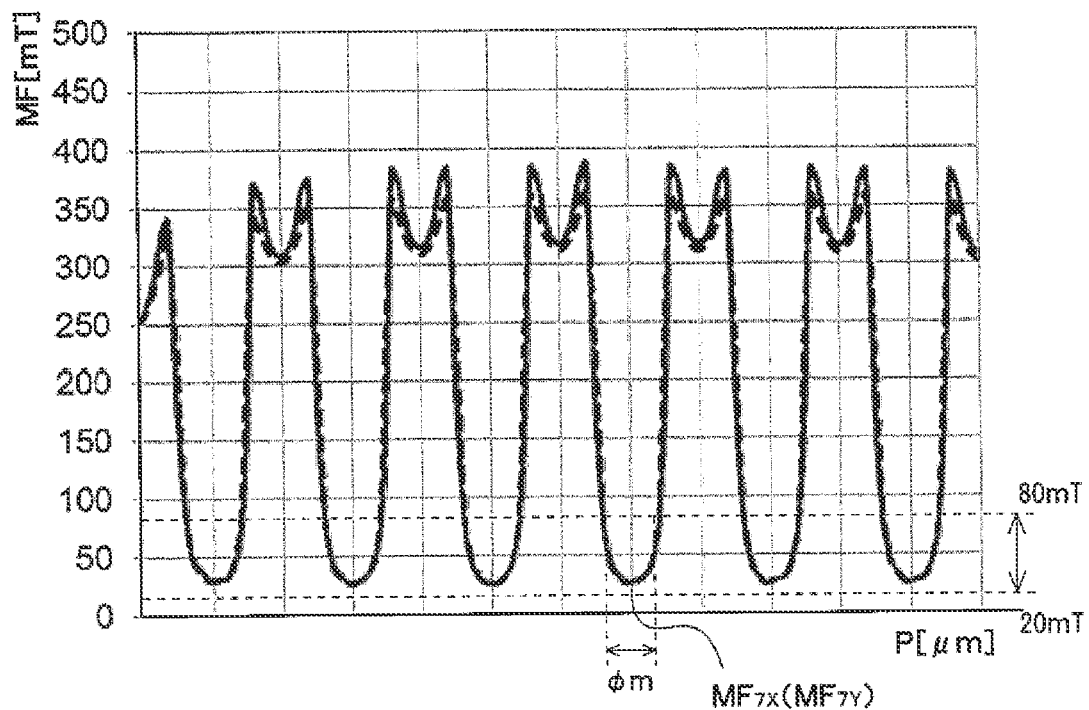
FIG. 19 is a characteristic chart showing an attenuation effect of a magnetic field intensity to be applied to the MR element in the case of using a soft magnetic body shield of Example 7.

The magnetic sensor 1 having the similar configuration to Example 1, except for having the configuration shown in FIG. 12A to FIG. 12B, i.e., forming the through-hole 12h with 0.2 $\varphi_m$ of diameter in the soft magnetic body shield 12, was prepared. An attenuation effect was confirmed based upon a curve $MF_{7X}$ that was obtained by measuring the magnetic field intensity along the MR elements 11 aligned in the X-axis direction and $MF_{7Y}$ that was obtained by measuring the magnetic field intensity along the MR elements 11 aligned in the Y-axis direction in the case of applying 200 mT of an external magnetic field to the magnetic sensor 1 in Example 7. The results are shown in Table 1 and FIG. 19. In Example 7, since the magnetic field intensities that were measured along the MR elements 11 aligned in the X-axis direction and those that were measured along the MR elements 11 aligned in the Y-axis direction are nearly the same, the curve $MF_{7X}$ and the curve $MF_{7Y}$ are depicted to nearly overlap (FIG. 19).

Example 8

Figure 20:
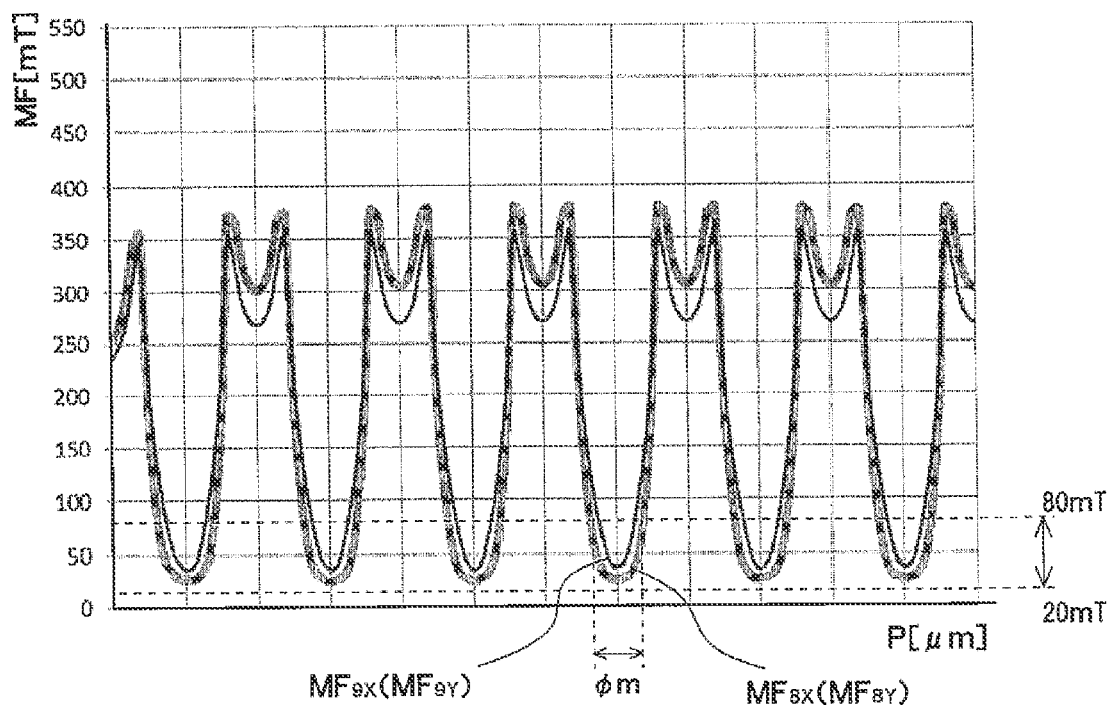
FIG. 20 is a characteristic chart showing an attenuation effect of a magnetic field intensity to be applied to the MR element in the case of using soft magnetic body shields of Examples 8 and 9.

The magnetic sensor 1 having the similar configuration to Example 1, except for having the configuration shown in FIG. 11A to FIG. 11B, i.e., setting the shape of the soft magnetic body shield 12 to be nearly conical with 2 $\varphi_m$ of the diameter of the bottom surface, and setting the thickness h of the soft magnetic body shield 12 at 2.0 $\varphi_m$, was prepared. An attenuation effect was confirmed based upon a curve $MF_{8X}$ (thick line) that was obtained by measuring the magnetic field intensity along the MR elements 11 aligned in the X-axis direction and $MF_{8Y}$ (thick line) that was obtained by measuring the magnetic field intensity along the MR elements 11 aligned in the Y-axis direction in the case of applying 200 mT of an external magnetic field to the magnetic sensor 1 in Example 8. The results are shown in Table 1 and FIG. 20. In Example 8, since the magnetic field intensities that were measured along the MR elements 11 aligned in the X-axis direction and those that were measured along the MR elements 11 aligned in the Y-axis direction are nearly the same, the curve $MF_{8X}$ and the curve $MF_{8Y}$ are depicted to nearly overlap (FIG. 20).

Example 9

The magnetic sensor 1 having the similar configuration to Example 8, except for setting the thickness h of the soft magnetic body shield 12 at $\varphi_m$, was prepared. An attenuation effect was confirmed based upon a curve $MF_{9X}$ (thin line) that was obtained by measuring the magnetic field intensity along the MR elements 11 aligned in the X-axis direction and $MF_{9Y}$ (thin line) that was obtained by measuring the magnetic field intensity along the MR elements 11 aligned in the Y-axis direction in the case of applying 200 mT of an external magnetic field to the magnetic sensor 1 in Example 9. The results are shown in Table 1 and FIG. 20. In Example 9, since the magnetic field intensities that were measured along the MR elements 11 aligned in the X-axis direction and those that were measured along the MR elements 11 aligned in the Y-axis direction are nearly the same, the curve $MF_{9X}$ and the curve $MF_{9Y}$ are depicted to nearly overlap (FIG. 20).

Example 10

Figure 21:
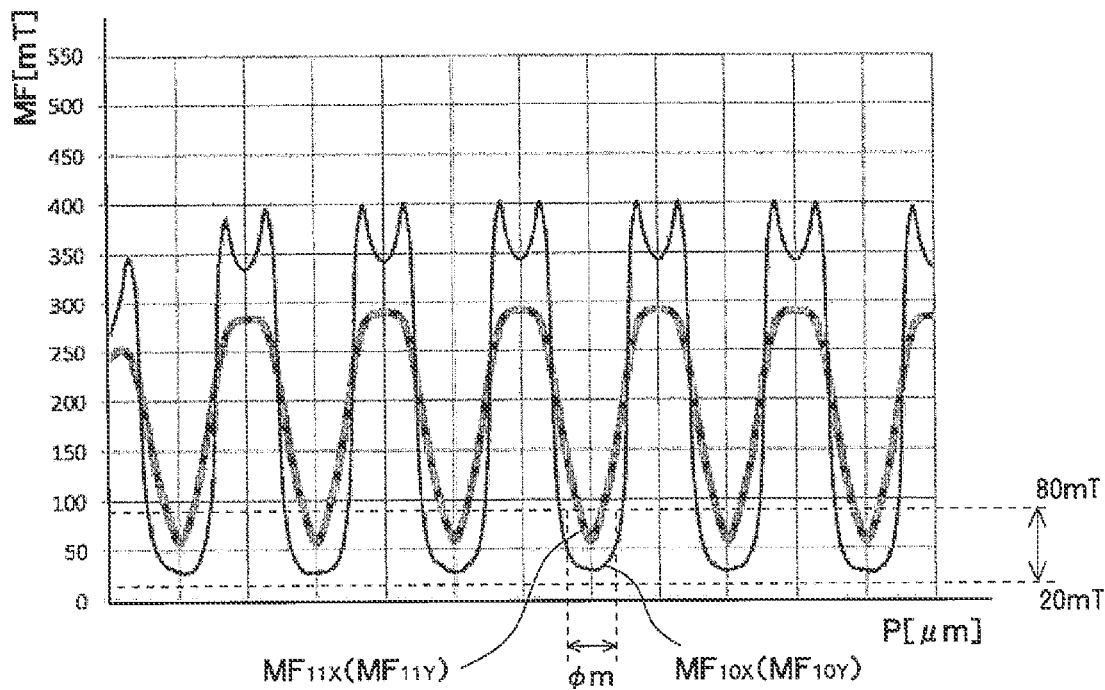
FIG. 21 is a characteristic chart showing an attenuation effect of a magnetic field intensity to be applied to the MR element in the case of using soft magnetic body shields of Examples 10 and 11.

The magnetic sensor 1 having the similar configuration to Example 1, except for having the configuration shown in FIG. 9A to FIG. 9B, i.e., having the configuration of the soft magnetic body shield 12 where the columnar portion 12c and the conical portion 12p are laminated in respective order, and setting the thickness in the central axis at $\varphi_m$, was prepared. An attenuation effect was confirmed based upon a curve $MF_{10X}$ (thin line) that was obtained by measuring the magnetic field intensity along the MR elements 11 aligned in the X-axis direction and $MF_{10Y}$ (thin line) that was obtained by measuring the magnetic field intensity along the MR elements 11 aligned in the Y-axis direction in the case of applying 200 mT of an external magnetic field to the magnetic sensor 1 in Example 10. The results are shown in Table 1 and FIG. 21. In Example 10, since the magnetic field intensities that were measured along the MR elements 11 aligned in the X-axis direction and those that were measured along the MR elements 11 aligned in the Y-axis direction are nearly the same, the curve $MF_{10X}$ and the curve $MF_{10Y}$ are depicted to nearly overlap (FIG. 21).

Example 11

The magnetic sensor 1 having the similar configuration to Example 10, except for arranging the soft magnetic body shield 12 immediately below the MR element 11, was prepared. The magnetic field intensities to be applied to the MR element in the case of applying 200 mT of an external magnetic field to the magnetic sensor 1 in Example 11 were obtained in the X-axis direction and the Y-axis direction within the plane of the magnetic sensor 1, and an attenuation effect was confirmed based upon a curve $MF_{10X}$ and a curve $MF_{11Y}$ (thick lines). The results are shown in Table 1 and FIG. 21. In Example 11, since the magnetic field intensities that were measured along the MR elements 11 aligned in the X-axis direction and those that were measured along the MR elements 11 aligned in the Y-axis direction are nearly the same, the curve $MF_{10X}$ and the curve $MF_{11Y}$ are depicted to nearly overlap (FIG. 21).

Example 12

Figure 22:
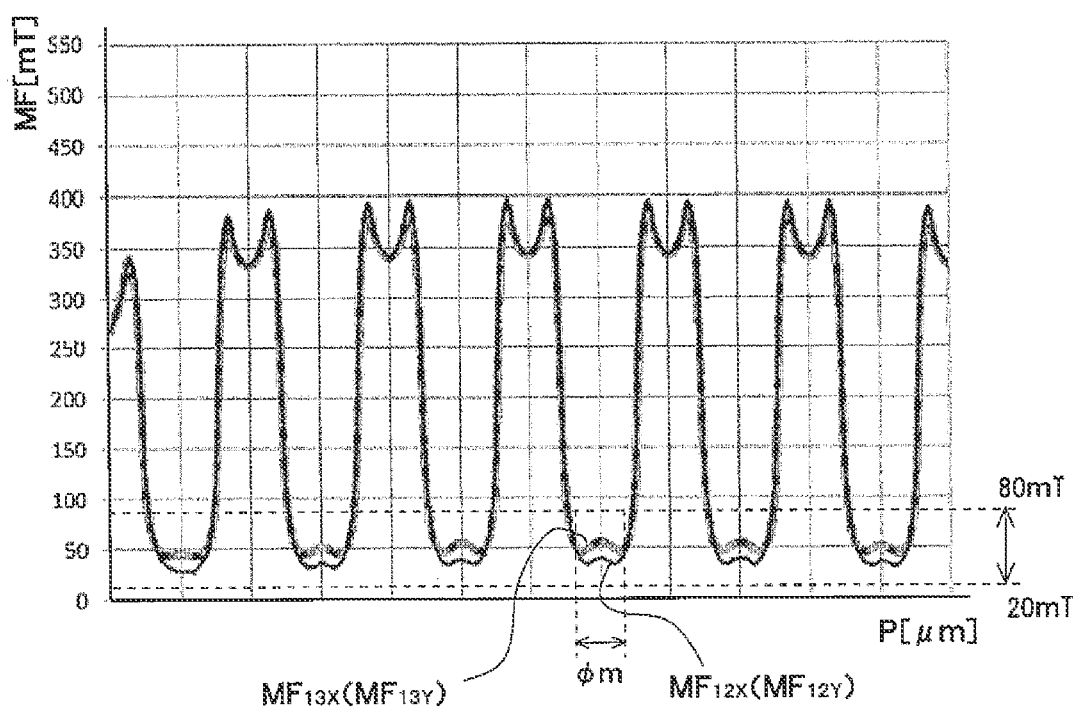
FIG. 22 is a characteristic chart showing an attenuation effect of a magnetic field intensity to be applied to the MR element in the case of using soft magnetic body shields of Examples 12 and 13.

The magnetic sensor 1 having the similar configuration to Example 1, except for having the configuration shown in FIG. 10, i.e., forming the mortar-shaped portion 12n on the upper surface of the soft magnetic body shield 12 and setting the thickness in the central axis at 0.8 $\varphi_m$, was prepared. The magnetic field intensities to be applied to the MR element in the case of applying 200 mT of an external magnetic field to the magnetic sensor 1 in Example 12 were obtained in the X-axis direction and the Y-axis direction within the plane of the magnetic sensor 1, and an attenuation effect was confirmed based upon a curve $MF_{12X}$ and a curve $MF_{12Y}$ (thin lines). The results are shown in Table 1 and FIG. 22. In Example 12, since the magnetic field intensities that were measured along the MR elements 11 aligned in the X-axis direction and those that were measured along the MR elements 11 aligned in the Y-axis direction are nearly the same, the curve $MF_{12X}$ and the curve $MF_{12Y}$ are depicted to nearly overlap (FIG. 22).

Example 13

The magnetic sensor 1 having the similar configuration to Example 12, except for arranging the soft magnetic body shield 12 immediately below the MR element 11, was prepared. The magnetic field intensities to be applied to the MR element in the case of applying 200 mT of an external magnetic field to the magnetic sensor 1 in Example 13 were obtained in the X-axis direction and the Y-axis direction within the plane of the magnetic sensor 1, and an attenuation effect was confirmed based upon a curve $MF_{13X}$ and a curve $MF_{13Y}$ (thick lines). The results are shown in Table 1 and FIG. 22. In Example 13, since the magnetic field intensities that were measured along the MR elements 11 aligned in the X-axis direction and those that were measured along the MR elements 11 aligned in the Y-axis direction are nearly the same, the curve $MF_{13X}$ and the curve $MF_{13Y}$ are depicted to nearly overlap (FIG. 22).

Example 14

Figure 23:
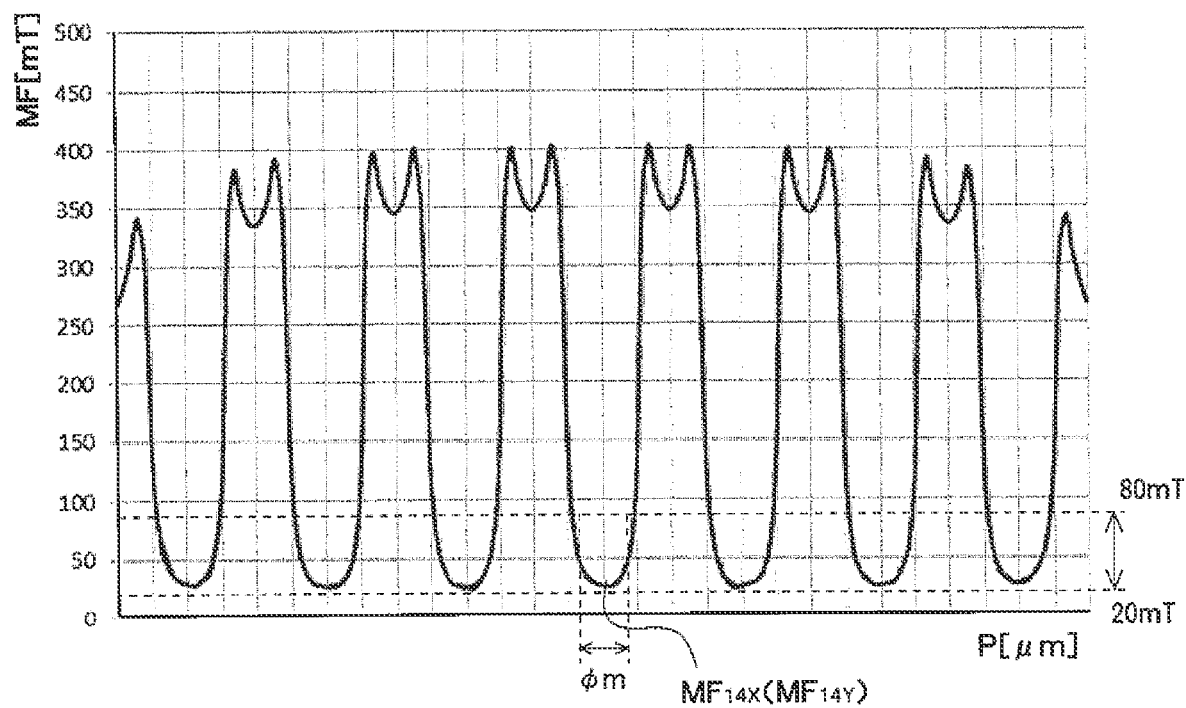
FIG. 23 is a characteristic chart showing an attenuation effect of a magnetic field intensity to be applied to the MR element in the case of using a soft magnetic body shield of Example 14.

The magnetic sensor 1 having the similar configuration to Example 1, except for having the configuration shown in FIG. 5A to FIG. 5B, i.e., arranging the soft magnetic body shield 12 immediately below the MR element 11, was prepared. The magnetic field intensities to be applied to the MR element in the case of applying 200 mT of an external magnetic field to the magnetic sensor 1 in Example 14 were obtained in the X-axis direction and the Y-axis direction within the plane of the magnetic sensor 1, and an attenuation effect was confirmed based upon a curve $MF_{14X}$ and a curve $MF_{14Y}$. The results are shown in Tale 1 and FIG. 23. In Example 14, since the magnetic field intensities that were measured along the MR elements 11 aligned in the X-axis direction and those that were measured along the MR elements 11 aligned in the Y-axis direction are nearly the same, the curve $MF_{14X}$ and the curve $MF_{14Y}$ are depicted to nearly overlap (FIG. 23).

Example 15

Figure 24:
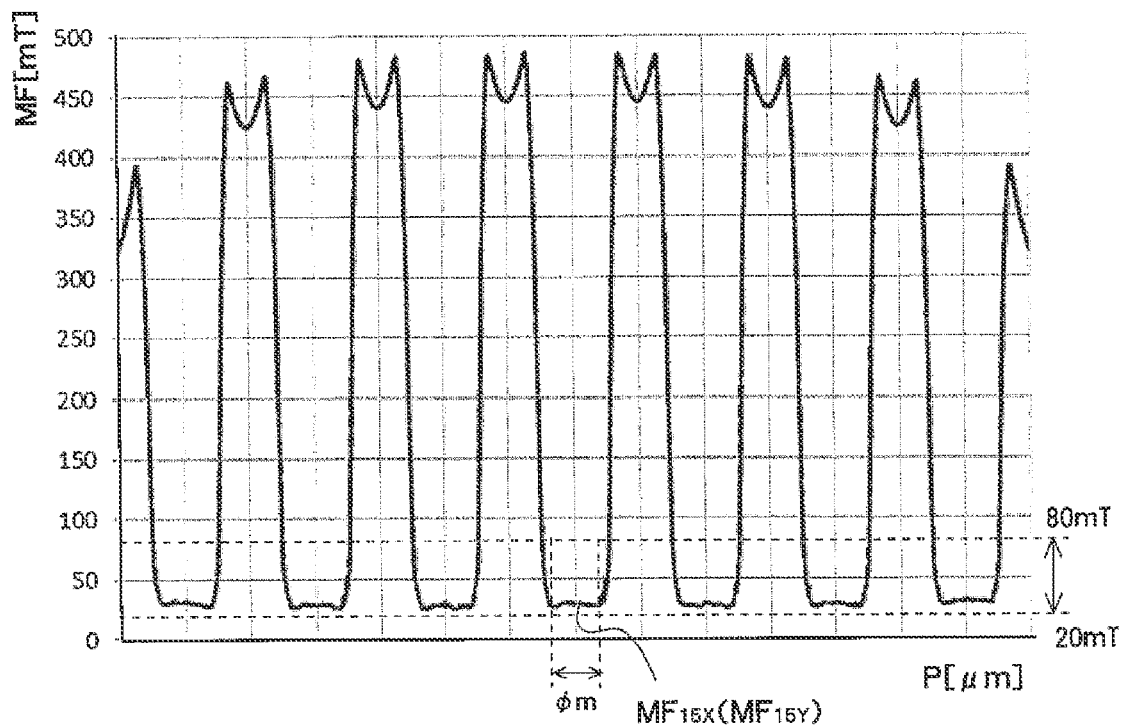
FIG. 24 is a characteristic chart showing an attenuation effect of a magnetic field intensity to be applied to the MR element in the case of using a soft magnetic body shield of Example 15.

The magnetic sensor 1 having the similar configuration to Example 1, except for having the configuration shown in FIG. 5C, i.e., arranging the two soft magnetic body shields 12 immediately above and immediately below the MR elements 11, respectively, was prepared. An attenuation effect was confirmed based upon a curve $MF_{15X}$ that was obtained by measuring the magnetic field intensity along the MR elements 11 aligned in the X-axis direction and $MF_{15Y}$ that was obtained by measuring the magnetic field intensity along the MR elements 11 aligned in the Y-axis direction in the case of applying 200 mT of an external magnetic field to the magnetic sensor 1 in Example 15. The results are shown in Table 1 and FIG. 24. In Example 15, since the magnetic field intensities that were measured along the MR elements 11 aligned in the X-axis direction and those that were measured along the MR elements 11 aligned in the Y-axis direction are nearly the same, the curve $MF_{15X}$ and the curve $MF_{15Y}$ are depicted to nearly overlap (FIG. 24).

Example 16

Figure 25:
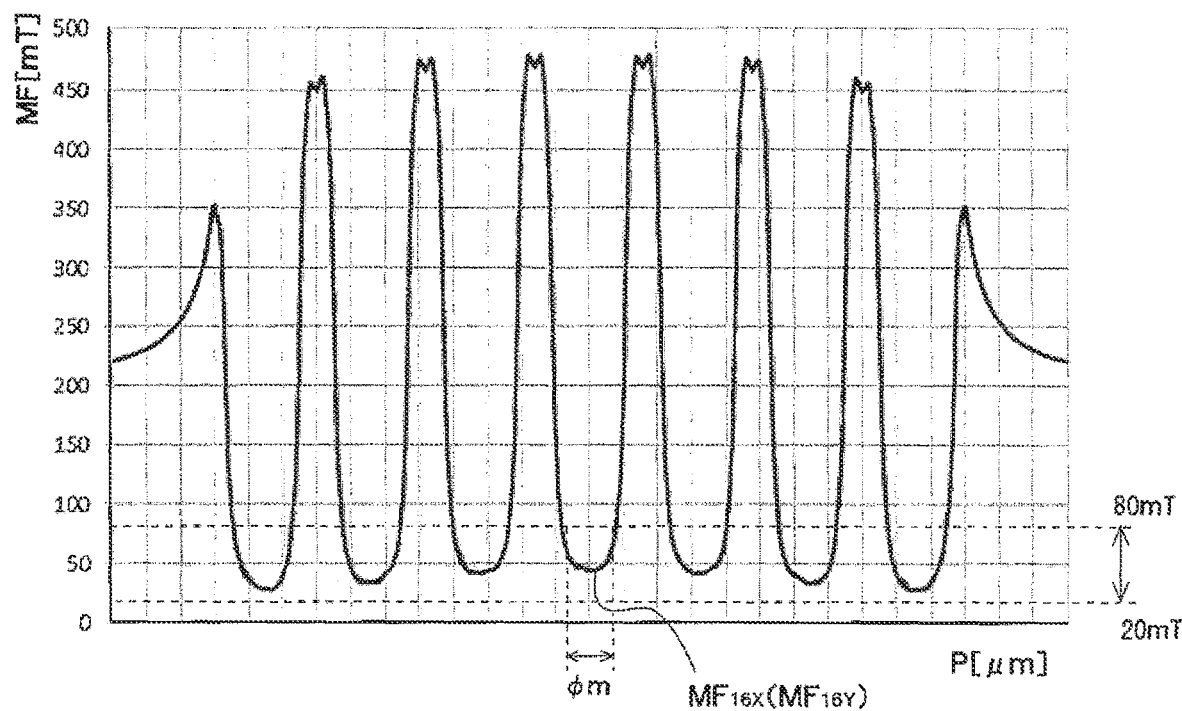
FIG. 25 is a characteristic chart showing an attenuation effect of a magnetic field intensity to be applied to the MR element in the case of using a soft magnetic body shield of Example 16.

The magnetic sensor 1 having the similar configuration to Example 1, except for setting the interval D between the adjacent soft magnetic body shields 12 (MR elements 11) at 2.6 $\varphi_m$, was prepared. An attenuation effect was confirmed based upon a curve $MF_{16X}$ that was obtained by measuring the magnetic field intensity along the MR elements 11 aligned in the X-axis direction and $MF_{16Y}$ that was obtained by measuring the magnetic field intensity along the MR elements 11 aligned in the Y-axis direction in the case of applying 200 mT of an external magnetic field to the magnetic sensor 1 in Example 16. The results are shown in Table 1 and FIG. 25. In Example 16, since the magnetic field intensities that were measured along the MR elements 11 aligned in the X-axis direction and those that were measured along the MR elements 11 aligned in the Y-axis direction are nearly the same, the curve $MF_{16X}$ and the curve $MF_{16Y}$ are depicted to nearly overlap (FIG. 25).

Example 17

Figure 26:
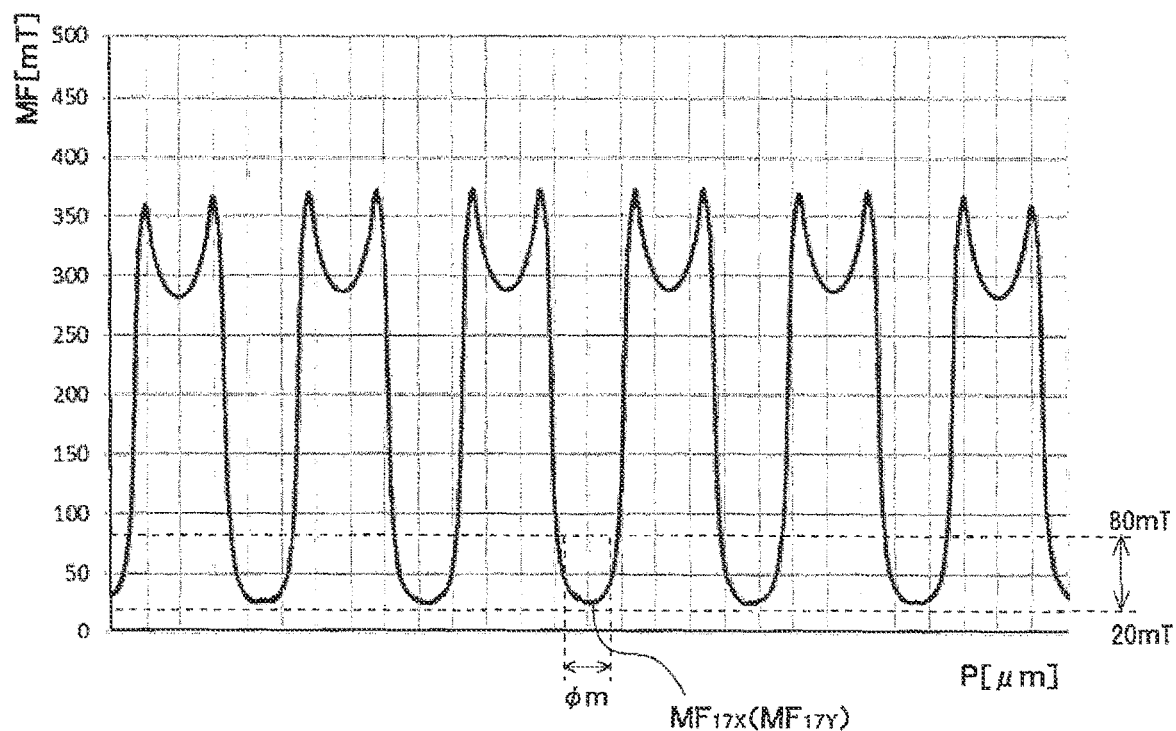
FIG. 26 is a characteristic chart showing an attenuation effect of a magnetic field intensity to be applied to the MR element in the case of using a soft magnetic body shield of Example 17.

The magnetic sensor 1 having the similar configuration to Example 1, except for setting the interval D between the adjacent soft magnetic body shields 12 (MR elements 11) at 4.0 $\varphi_m$, was prepared. An attenuation effect was confirmed based upon a curve $MF_{17X}$ that was obtained by measuring the magnetic field intensity along the MR elements 11 aligned in the X-axis direction and $MF_{17Y}$ that was obtained by measuring the magnetic field intensity along the MR elements 11 aligned in the Y-axis direction in the case of applying 200 mT of an external magnetic field to the magnetic sensor 1 in Example 17. The results are shown in Table 1 and FIG. 26. In Example 17, since the magnetic field intensities that were measured along the MR elements 11 aligned in the X-axis direction and those that were measured along the MR elements 11 aligned in the Y-axis direction are nearly the same, the curve $MF_{17X}$ and the curve $MF_{17Y}$ are depicted to nearly overlap (FIG. 26).

Comparative Example 1

Figure 27:
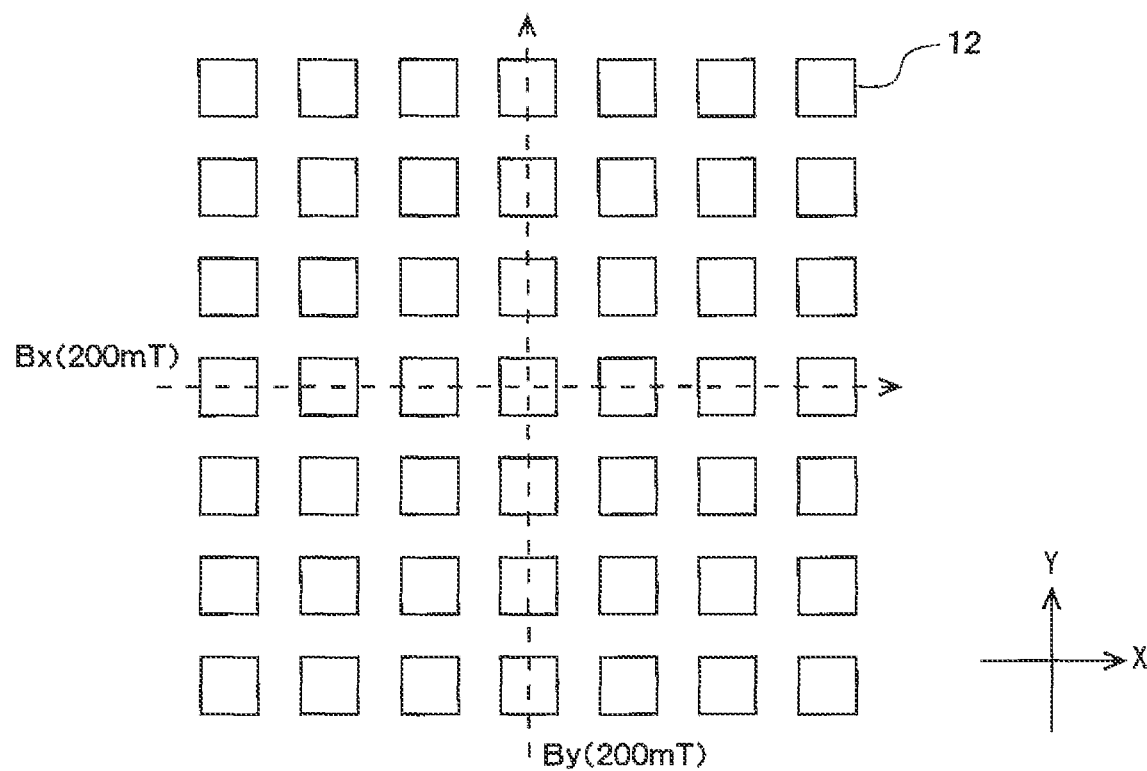
FIG. 27A is a schematic plan view of a nearly square column-shaped soft magnetic body shield used in Comparative Example 1.
FIG. 27B is a pattern chart showing an attenuation effect of a magnetic field intensity to be applied to the MR element in the case of using a soft magnetic body shield of Comparative Example 1.
Figure 27:
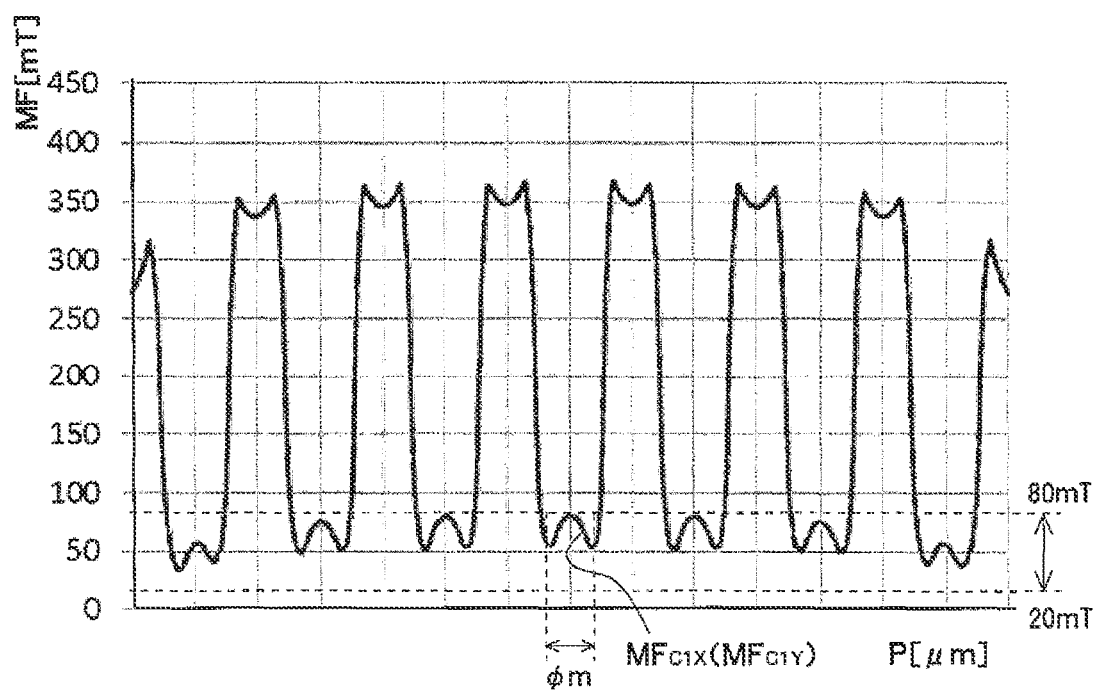

The magnetic sensor 1 having the similar configuration to Example 1, except for setting the soft magnetic body shield 12 to be a nearly quadratic prism as shown in FIG. 27A, was prepared. An attenuation effect was confirmed based upon a curve $MF_{C1X}$ that was obtained by measuring the magnetic field intensity along the MR elements 11 aligned in the X-axis direction and $MF_{C1Y}$ that was obtained by measuring the magnetic field intensity along the MR elements 11 aligned in the Y-axis direction in the case of applying 200 mT of an external magnetic field to the magnetic sensor 1 in Comparative Example 1. The results are shown in Table 1 and FIG. 27B. In Comparative Example 1, since the magnetic field intensities that were measured along the MR elements 11 aligned in the X-axis direction and those that were measured along the MR elements 11 aligned in the Y-axis direction are nearly the same, the curve $MF_{C1X}$ and the curve $MF_{C1Y}$ are depicted to nearly overlap (FIG. 27B).

Comparative Example 2

Figure 28:
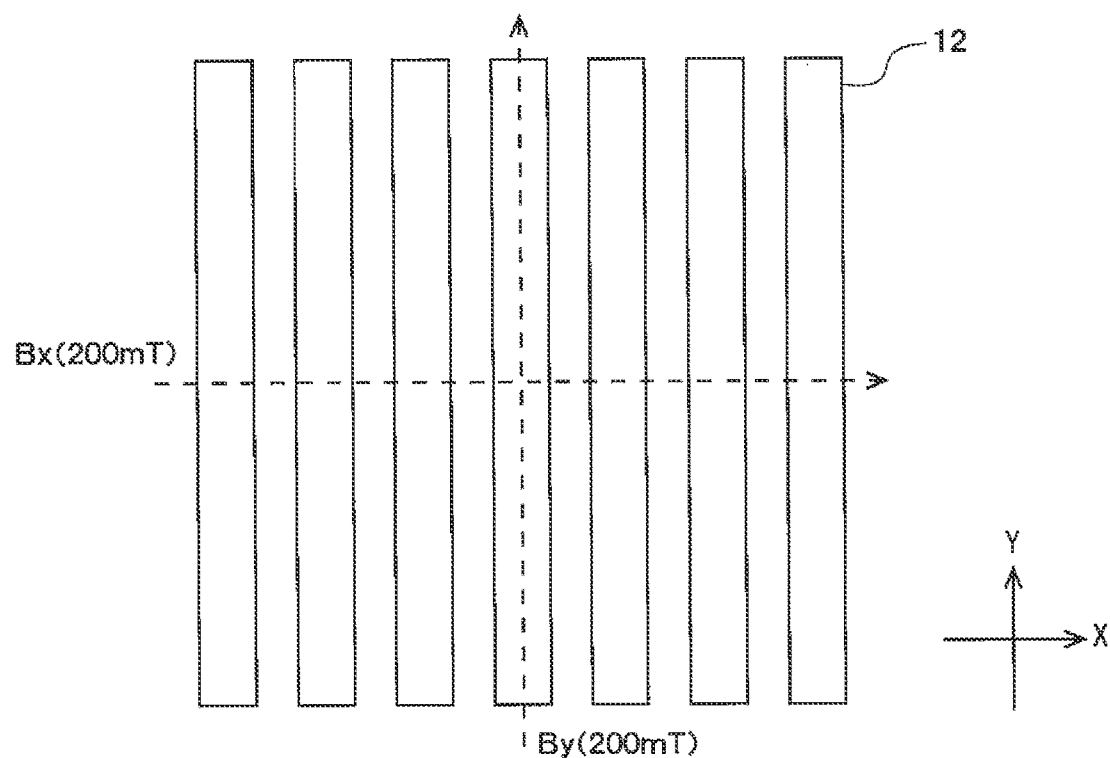
FIG. 28A is a schematic plan view of a soft magnetic body shield having a substantially rectangular shape in plan view used in Comparative Example 2.
FIG. 28B is a pattern chart showing an attenuation effect of a magnetic field intensity to be applied to the MR element in the case of using a soft magnetic body shield of Comparative Example 2.
Figure 28:
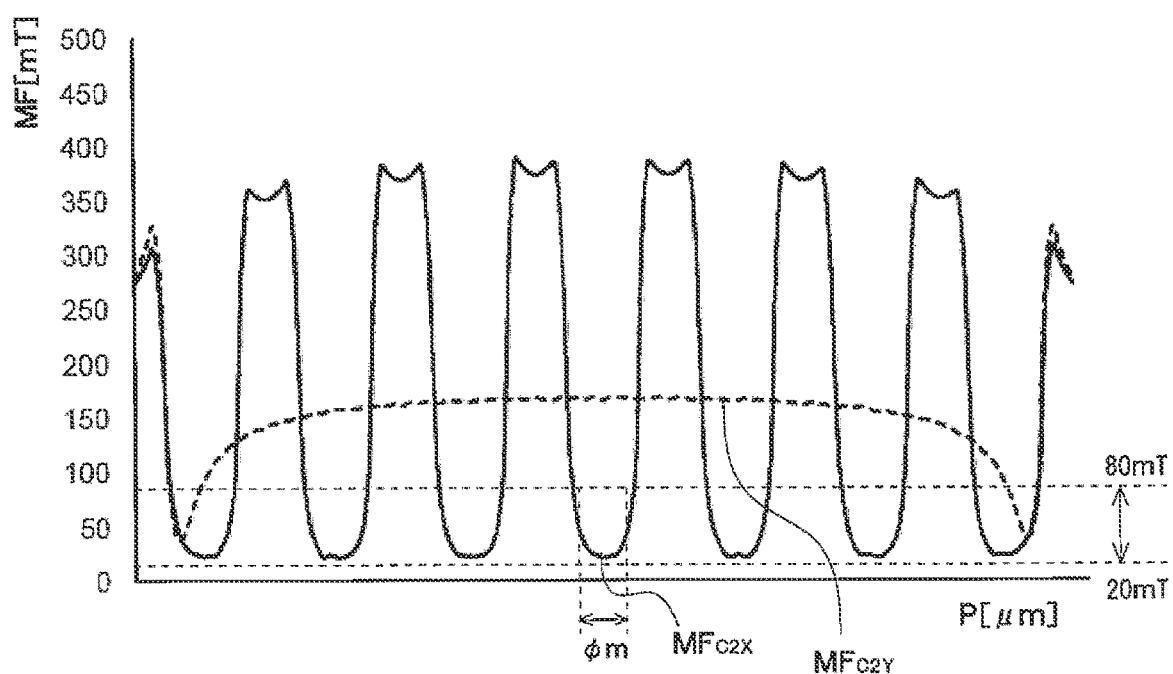

The magnetic sensor 1 having the similar configuration to Example 1, except for setting the soft magnetic body shield 12 to be nearly rectangular in a plan view as shown in FIG. 28A, was prepared. In Comparative Example 2, the magnetic sensor 1 where a plurality of the planar-view nearly-rectangular soft magnetic fields 12 that regarded the vertical direction of the drawing as a longitudinal direction were arranged in a direction that was orthogonal to that longitudinal direction was used. An attenuation effect was confirmed based upon a curve $MF_{C2X}$ that was obtained by measuring the magnetic field intensity along the MR elements 11 aligned in the X-axis direction and $MF_{C2Y}$ that was obtained by measuring the magnetic field intensity along the MR elements 11 aligned in the Y-axis direction in the case of applying 200 mT of an external magnetic field to the magnetic sensor 1 in Comparative Example 2. The results are shown in Table 1 and FIG. 28B. In Comparative Example 2, the magnetic field intensities measured along the MR elements 11 aligned in the X-axis direction are depicted as the $MF_{C2X}$, and the magnetic field intensities measured along the MR elements 11 aligned in the Y-axis direction are depicted as the $MF_{C2Y}$ (FIG. 28B).

Comparative Example 3

Figure 29:
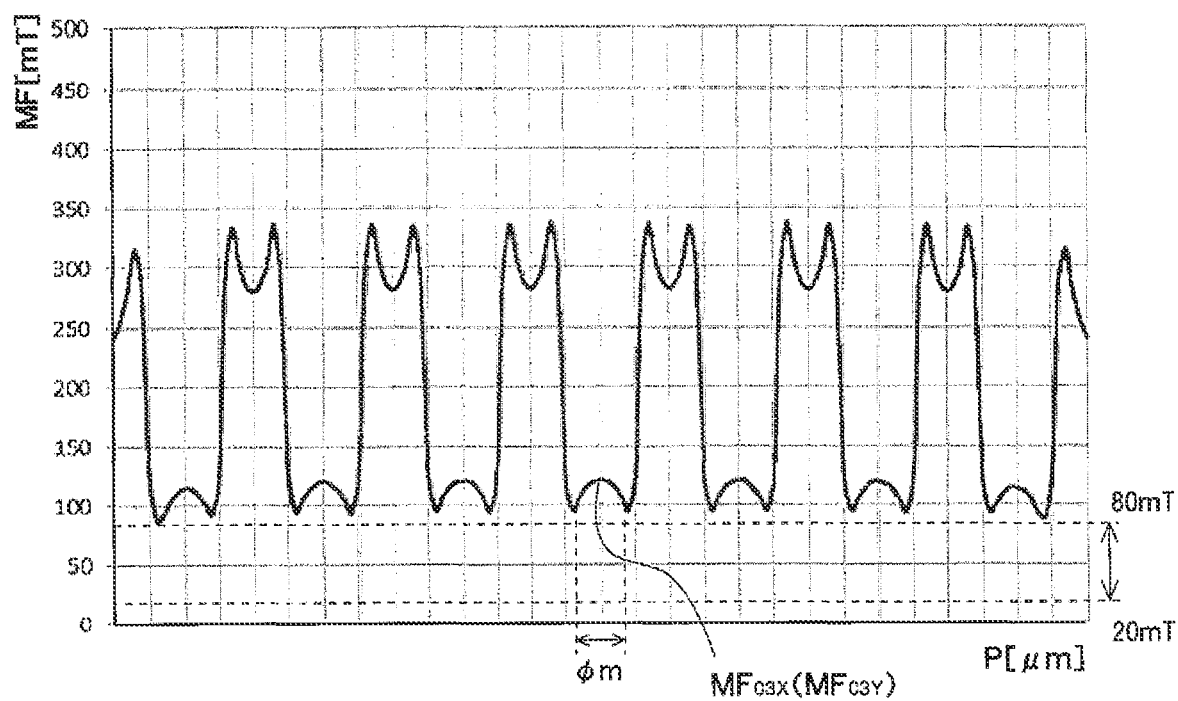
FIG. 29 is a characteristic chart showing an attenuation effect of a magnetic field intensity to be applied to the MR element in the case of using a soft magnetic body shield of Comparative Example 3.

The magnetic sensor 1 having the similar configuration to Example 1, except for setting the thickness h of the soft magnetic body shield 12 at 0.3 $\varphi_m$, was prepared. An attenuation effect was confirmed based upon a curve $MF_{C3X}$ that was obtained by measuring the magnetic field intensity along the MR elements 11 aligned in the X-axis direction and $MF_{C3Y}$ that was obtained by measuring the magnetic field intensity along the MR elements 11 aligned in the Y-axis direction in the case of applying 200 mT of an external magnetic field to the magnetic sensor 1 in Comparative Example 3. The results are shown in Table 1 and FIG. 29. In Comparative Example 3, since the magnetic field intensities that were measured along the MR elements 11 aligned in the X-axis direction and those that were measured along the MR elements 11 aligned in the Y-axis direction are nearly the same, the curve $MF_{C3X}$ and the curve $MF_{C3Y}$ are depicted to be nearly overlapped (FIG. 29).

TABLE 1

| | $\varphi s$ | h | D | Attenuation effect |
|---|---|---|---|---|
| Example 1 | 2.0 $\varphi m$ | $\varphi m$ | 3.3 $\varphi m$ | ○ |
| Example 2 | 2.6 $\varphi m$ | $\varphi m$ | 3.3 $\varphi m$ | ○ |
| Example 3 | 2.0 $\varphi m$ | 1.6 $\varphi m$ | 3.3 $\varphi m$ | ○ |
| Example 4 | 1.3 $\varphi m$ | $\varphi m$ | 3.3 $\varphi m$ | Δ |
| Example 5 | 2.0 $\varphi m$ | 0.8 $\varphi m$ | 3.3 $\varphi m$ | Δ |
| Example 6 | 2.0 $\varphi m$ | $\varphi m$ | 3.3 $\varphi m$ | ○ |
| Example 7 | 2.0 $\varphi m$ | $\varphi m$ | 3.3 $\varphi m$ | ○ |
| Example 8 | 2.0 $\varphi m$ | 2.0 $\varphi m$ | 3.3 $\varphi m$ | Δ |
| Example 9 | 2.0 $\varphi m$ | $\varphi m$ | 3.3 $\varphi m$ | Δ |
| Example 10 | 2.0 $\varphi m$ | $\varphi m$ | 3.3 $\varphi m$ | ○ |
| Example 11 | 2.0 $\varphi m$ | $\varphi m$ | 3.3 $\varphi m$ | Δ |
| Example 12 | 2.0 $\varphi m$ | 0.8 $\varphi m$ | 3.3 $\varphi m$ | ○ |
| Example 13 | 2.0 $\varphi m$ | 0.8 $\varphi m$ | 3.3 $\varphi m$ | Δ |
| Example 14 | 2.0 $\varphi m$ | $\varphi m$ | 3.3 $\varphi m$ | ○ |
| Example 15 | 2.0 $\varphi m$ | $\varphi m$ | 3.3 $\varphi m$ | ○ |
| Example 16 | 2.0 $\varphi m$ | $\varphi m$ | 2.6 $\varphi m$ | Δ |
| Example 17 | 2.0 $\varphi m$ | $\varphi m$ | 4.0 $\varphi m$ | ○ |
| Comparative Example 1 | 2.0 $\varphi m$ | $\varphi m$ | 3.3 $\varphi m$ | x |
| Comparative Example 2 | 2.0 $\varphi m$ | $\varphi m$ | 3.3 $\varphi m$ | x |
| Comparative Example 3 | 2.0 $\varphi m$ | 0.3 $\varphi m$ | 3.3 $\varphi m$ | x |

As it is clear from the results in Table 1, FIGS. 13 to 26, FIG. 27B, FIG. 28B and FIG. 29, because the soft magnetic body shield(s) 12, in which the diameter $\varphi_s$ is 1.3 times or more than the diameter $\varphi_m$ of the MR element 11 and the thickness h of which exceeds 0.3 times the diameter $\varphi_m$ of the MR element 11, is positioned above and/or below the MR element(s) and the size of the MR element 11 becomes the size to be physically included within the perimeter of the soft magnetic body shield 12 in a plan view, even if an external magnetic field that exceeds the detection range of the MR element 11 is applied, it has been confirmed that the external magnetic field, the magnetic field intensity of which has been attenuated to that within 20 to 80 mT of the detection range, is applied to the MR element 11. Further, according to the results above, compared to the soft magnetic body shield having a nearly-quadratic prism shape or nearly rectangular shape in a plan view, with the soft magnetic body shield having nearly cylindrical shape, a columnar shape where its shape in a plan view is N-sided polygon (N is 6 or greater even number), a shape in which a conical portion is positioned on a columnar portion, a shape in which a convexity of an N-sided pyramid (N is 6 or greater even number) on an N-sided prism (N is 6 or greater even number), a columnar shape in which an upper surface is sagged to be the mortar-shaped, a nearly-conical shape, or an N-sided pyramid shape (N is 6 or greater even number) or the like, it has been confirmed that the magnetic field intensity is attenuated to 20 to 80 mT of the detection range, and, the magnetic field intensity will not be substantially changed within the plane of the MR element 11. Thus, it is inferred that a positional detection error, such as a rotational position or a linear displacement of an object, can be reduced if the magnetic sensor 1 that fulfills the requirements above is used.

DESCRIPTION OF SYMBOLS

1 . . . magnetic sensor
11 . . . magnetoresistive effect element (MR element)
12 . . . soft magnetic body shield
12*c* . . . columnar portion (prismatic portion)
12*p* . . . conical portion (convexity)
12*n* . . . mortar-shaped portion (concave portion)
12*h* . . . through-hole

What is claimed is:
1. A magnetic sensor comprising:
  a plurality of magnetoresistive effect elements (MR elements), which can detect an external magnetic field, and
  a plurality of soft magnetic body shields, wherein
  the plurality of MR elements are laminated on and/or under the plurality of soft magnetic body shields in a side view, respectively,
  the size of each of the MR elements is physically included within a perimeter of each of the soft magnetic body shields in a plan view, and
  the plurality of the MR elements is two-dimensionally arranged in an array.
2. The magnetic sensor according to claim 1, wherein all intervals between adjacent MR elements are the same.
3. The magnetic sensor according to claim 1, wherein a shape of each of the soft magnetic body shields in the plan view is nearly circular.
4. The magnetic sensor according to claim 1, wherein a shape of each of the soft magnetic body shields in the plan view is an N-sided polygon (N is 6 or greater even number).
5. The magnetic sensor according to claim 1, wherein each of the soft magnetic body shields is columnar.
6. The magnetic sensor according to claim 1, wherein each of the soft magnetic body shields is conical.
7. The magnetic sensor according to claim 1, wherein each of the soft magnetic body shields includes a first ridge line, and a second ridge line and a third ridge line that are inclined with respect to the first ridge line in the side view,
  the first ridge line is parallel to an arrangement direction of the plurality of MR elements, and
  the second ridge line and the third ridge line are non-parallel to each other.

8. The magnetic sensor according to claim 1, wherein each of the soft magnetic body shields includes a columnar portion that comprises a first surface and a second surface, wherein the second surface faces the first surface, and a convexity, which protrudes from the first surface of the columnar portion and is positioned to allow the second surface to face each of the MR elements.
9. The magnetic sensor according to claim 1, wherein each of the soft magnetic body shields includes a columnar portion that comprises a first surface and a second surface, wherein the second surface faces the first surface, and a convexity, which protrudes from the first surface of the columnar portion.
10. The magnetic sensor according to claim 1, wherein each of the soft magnetic body shields includes a columnar portion that comprises a first surface and a second surface, wherein the second surface faces the first surface, and a concave portion, which is formed on the first surface of the columnar portion and is positioned to allow the second surface to face each of the MR elements.
11. The magnetic sensor according to claim 1, wherein each of the soft magnetic body shields includes a columnar portion that comprises a first surface and a second surface, wherein the second surface faces the first surface, and a concave portion, which is formed on the first surface of the columnar portion.
12. The magnetic sensor according to claim 1, wherein each of the soft magnetic body shields comprises a through-hole that penetrates through the soft magnetic body shield in a thickness direction.
13. The magnetic sensor according to claim 1, wherein a diameter $\varphi_s$ of each of the soft magnetic body shields and a diameter $\varphi_m$ of each of the MR elements fulfill a relationship in a following formula (1):

$$\varphi_s \geq 1.3\ \varphi_m. \tag{1}$$

14. The magnetic sensor according to claim 1, wherein thickness h of each of the soft magnetic body shields and a diameter $\varphi_m$ of each of the MR elements fulfill a relationship in a following formula (2):

$$h > 0.3\ \varphi_m. \tag{2}$$

15. The magnetic sensor according to claim 1, wherein a harmonic component $V_{3rd}$, which is output in the case of applying the external magnetic field with a magnetic field intensity that exceeds 70 mT (Millitesla) to each of the MR elements, and the harmonic component $V_{3rd}$, which is output in the case of applying the external magnetic field with 70 mT or less of a magnetic field intensity to each of the MR elements, are the same.
16. The magnetic sensor according to claim 1, wherein a diameter $\varphi_s$ of the soft magnetic body shield is 2.00 to 2.75 times a diameter $\varphi_m$ of the corresponding MR element.
17. A magnetic sensor comprising:
  a plurality of magnetoresistive effect elements (MR elements), which can detect an external magnetic field, and
  a plurality of soft magnetic body shields, wherein
  the plurality of MR elements are laminated on and/or under the plurality of soft magnetic body shields in a side view, respectively, the size of each of the MR elements is physically included within a perimeter of each of the soft magnetic body shields in a plan view, the plurality of the MR elements is two-dimensionally arranged in an array, each of the soft magnetic body shields includes a first ridge line, and a second ridge line and a third ridge line that are inclined with respect to the first ridge line in the side view, the first ridge line is parallel to an arrangement direction of the plurality of MR elements, the second ridge line and the third ridge line are non-parallel to each other.

18. A magnetic sensor comprising:

a plurality of magnetoresistive effect elements (MR elements), which can detect an external magnetic field, and a plurality of soft magnetic body shields, wherein the plurality of MR elements are laminated on and/or under the plurality of soft magnetic body shields in a side view, respectively, the size of each of the MR elements is physically included within a perimeter of each of the soft magnetic body shields in a plan view, the plurality of the MR elements is two-dimensionally arranged in an array, and each of the soft magnetic body shields includes a columnar portion that comprises a first surface and a second surface, wherein the second surface faces the first surface, and a convexity, which protrudes from the first surface of the columnar portion.

19. A magnetic sensor comprising:

a plurality of magnetoresistive effect elements (MR elements), which can detect an external magnetic field, and a plurality of soft magnetic body shields, wherein the plurality of MR elements are laminated on and/or under the plurality of soft magnetic body shields in a side view, respectively, the size of each of the MR elements is physically included within a perimeter of each of the soft magnetic body shields in a plan view, the plurality of the MR elements is two-dimensionally arranged in an array, and each of the soft magnetic body shields includes a columnar portion that comprises a first surface and a second surface, wherein the second surface faces the first surface, and a concave portion, which is formed on the first surface of the columnar portion.

* * * * *